(12) United States Patent
Naoki et al.

(10) Patent No.: US 7,607,967 B2
(45) Date of Patent: Oct. 27, 2009

(54) SUBSTRATE PROCESSING METHOD AND SUBSTRATE PROCESSING APPARATUS

(75) Inventors: Kazuki Naoki, Kyoto (JP); Katsuhiko Miya, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 230 days.

(21) Appl. No.: 11/612,948

(22) Filed: Dec. 19, 2006

(65) Prior Publication Data
US 2007/0141951 A1  Jun. 21, 2007

(30) Foreign Application Priority Data
Dec. 20, 2005  (JP) .............................. 2005-366298

(51) Int. Cl.
*B24B 49/00* (2006.01)
(52) U.S. Cl. .............................. 451/5; 451/10; 451/11; 451/44; 451/54; 451/398; 451/446
(58) Field of Classification Search ...................... 451/5, 451/10, 11, 36, 41, 44, 54, 285, 287, 288, 451/365, 385, 398, 446; 156/345.11, 345.17, 156/345.21; 134/33, 148, 182, 183, 151, 134/153; 216/84, 88
See application file for complete search history.

(56) References Cited

U.S. PATENT DOCUMENTS

| | | | |
|---|---|---|---|
| 6,683,007 | B1 | 1/2004 | Yamasaki et al. |
| 2004/0159343 | A1 | 8/2004 | Shimbara et al. |
| 2004/0226655 | A1* | 11/2004 | Kajino et al. .......... 156/345.11 |
| 2005/0276921 | A1 | 12/2005 | Miya et al. |
| 2006/0021636 | A1 | 2/2006 | Miya |
| 2008/0035610 | A1 | 2/2008 | Miya et al. |

FOREIGN PATENT DOCUMENTS

| | | |
|---|---|---|
| JP | 4-186626 | 7/1992 |
| JP | 9-107023 | 4/1997 |
| JP | 2000-269178 | 9/2000 |
| JP | 2003-88793 | 3/2003 |
| JP | 2004-111902 | 4/2004 |
| JP | 2006-32891 | 2/2006 |

OTHER PUBLICATIONS

U.S. Office Action issued in corresponding U.S. Appl. No. 11/154,363.

* cited by examiner

*Primary Examiner*—Eileen P. Morgan
(74) *Attorney, Agent, or Firm*—Ostrolenk Faber LLP

(57) ABSTRACT

A holding mode is selectively switched, in accordance with the content of processing of a substrate, among three holding modes: (a) a first holding mode in which while first support pins F1 through F12 abut on the back surface of a substrate W and support the substrate W, the substrate W is held because of nitrogen gas which is supplied to the front surface of the substrate W; (b) a second holding mode in which while second support pins S1 through S12 abut on the edge surface of the substrate W as the substrate W moves along the horizontal direction, thereby restricting horizontal movement of the substrate W, and abut on the back surface of the substrate W, thereby supporting the substrate W, the substrate W is held because of nitrogen gas which is supplied to the back surface of the substrate W; and (c) a third holding mode in which while the first and the second support pins F1 through F12 and support pins S1 through S12 abut on the back surface of the substrate W, the substrate W is held because of nitrogen gas which is supplied to the front surface of the substrate W.

12 Claims, 22 Drawing Sheets

F I G. 7
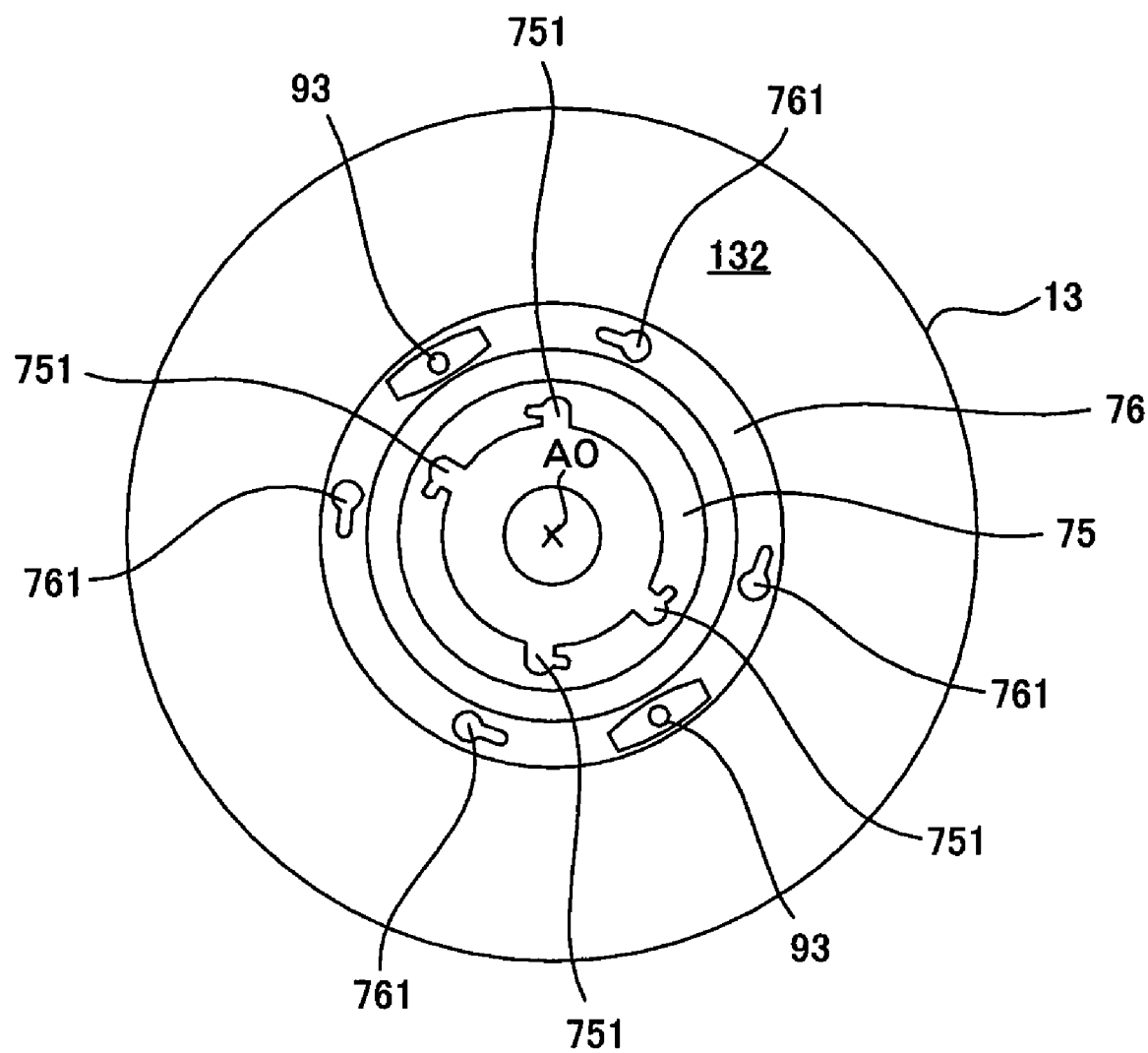

F I G. 8
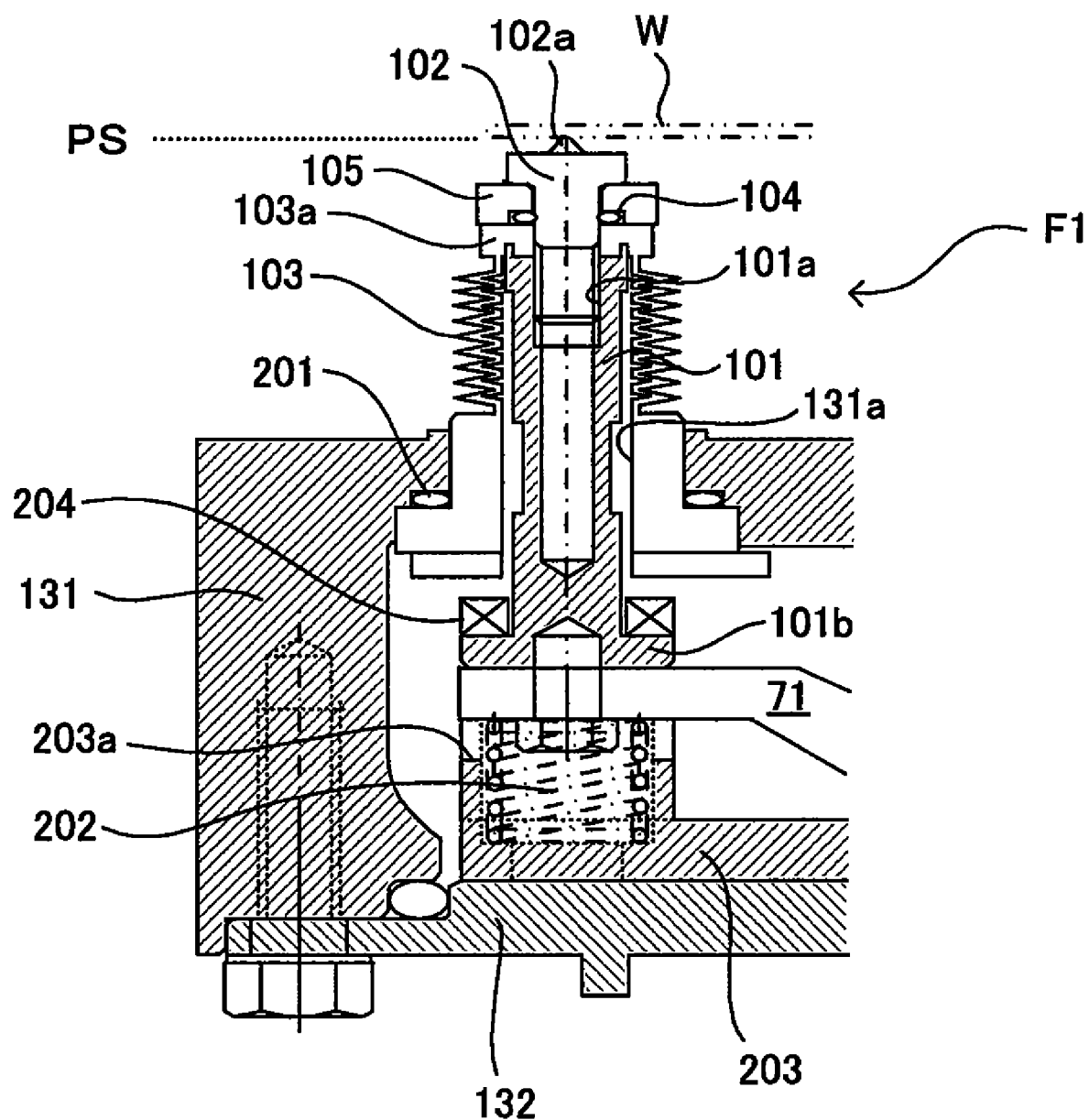

F I G. 1 3
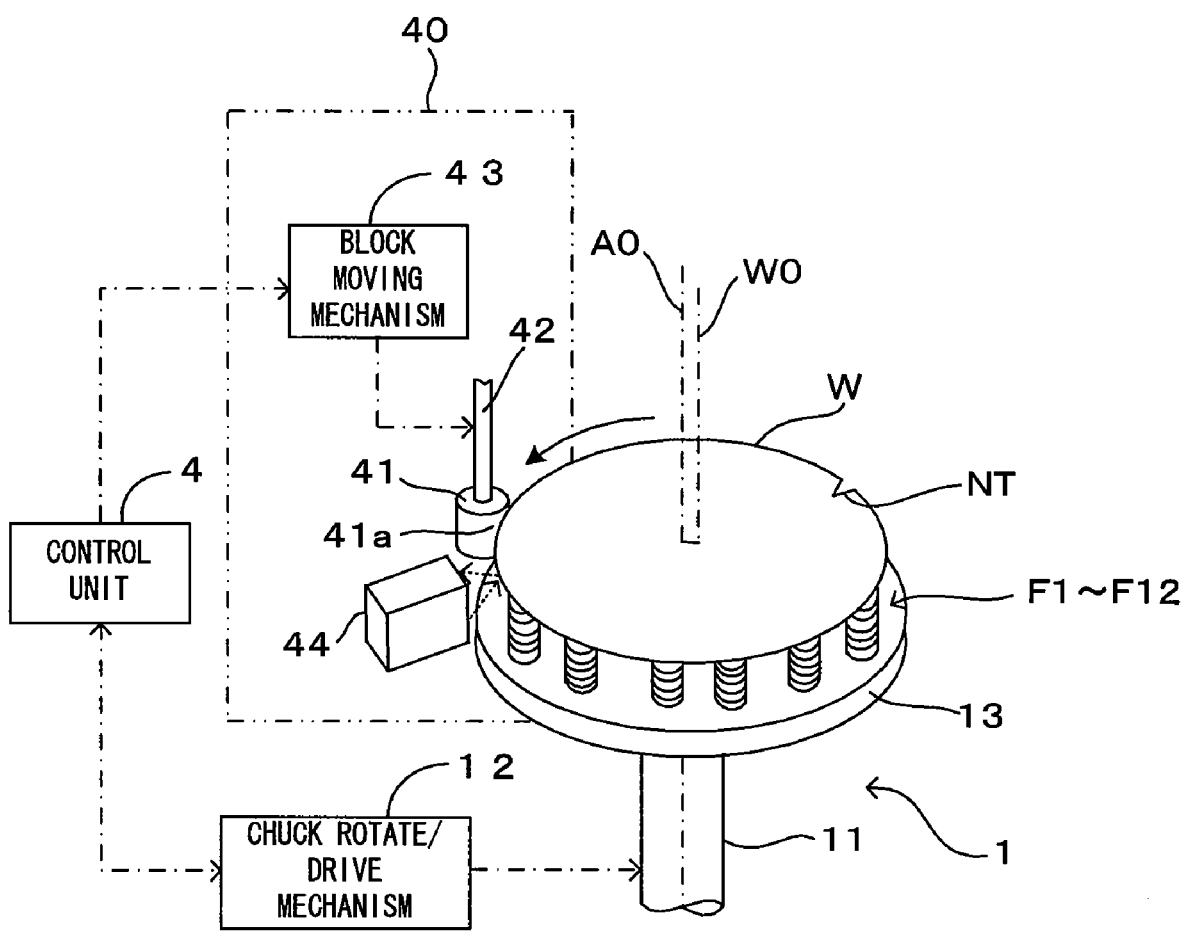

F I G. 1 5
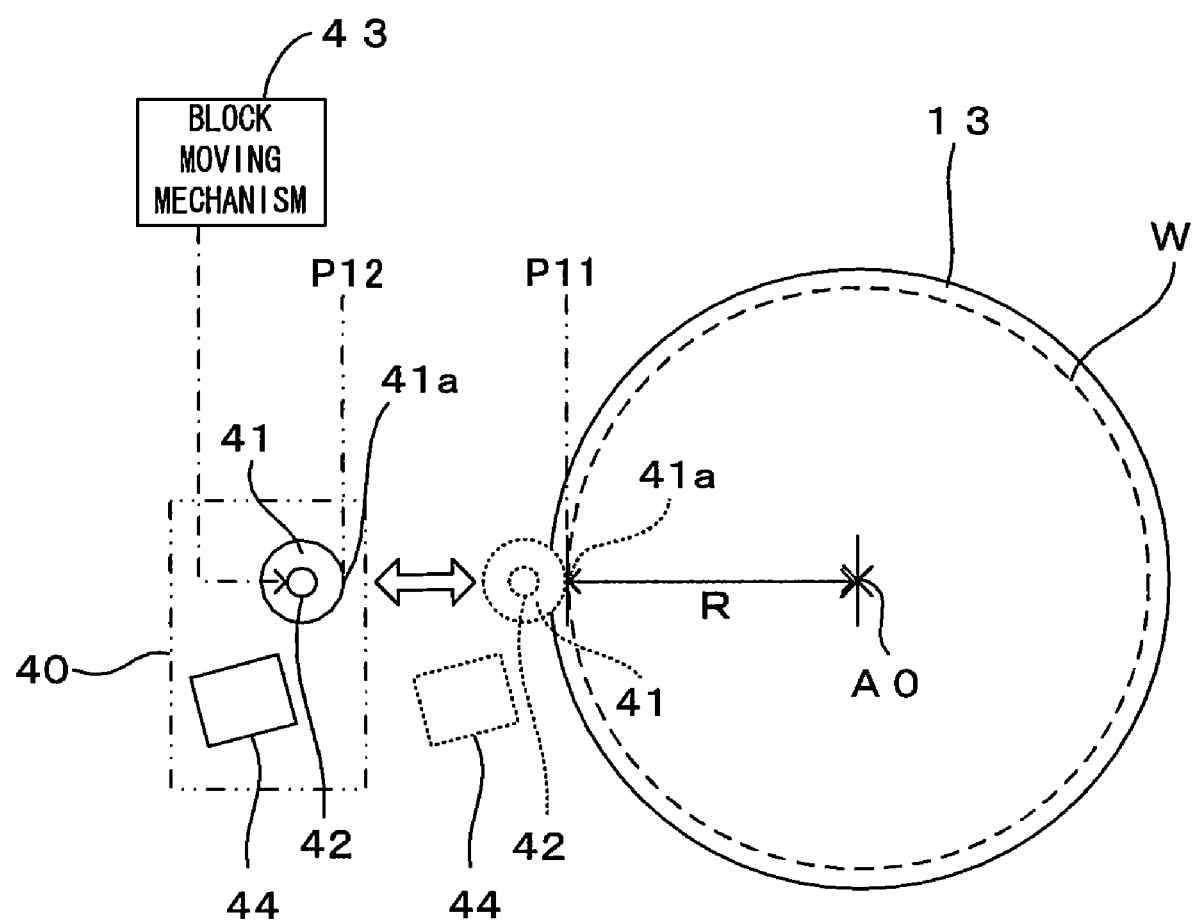

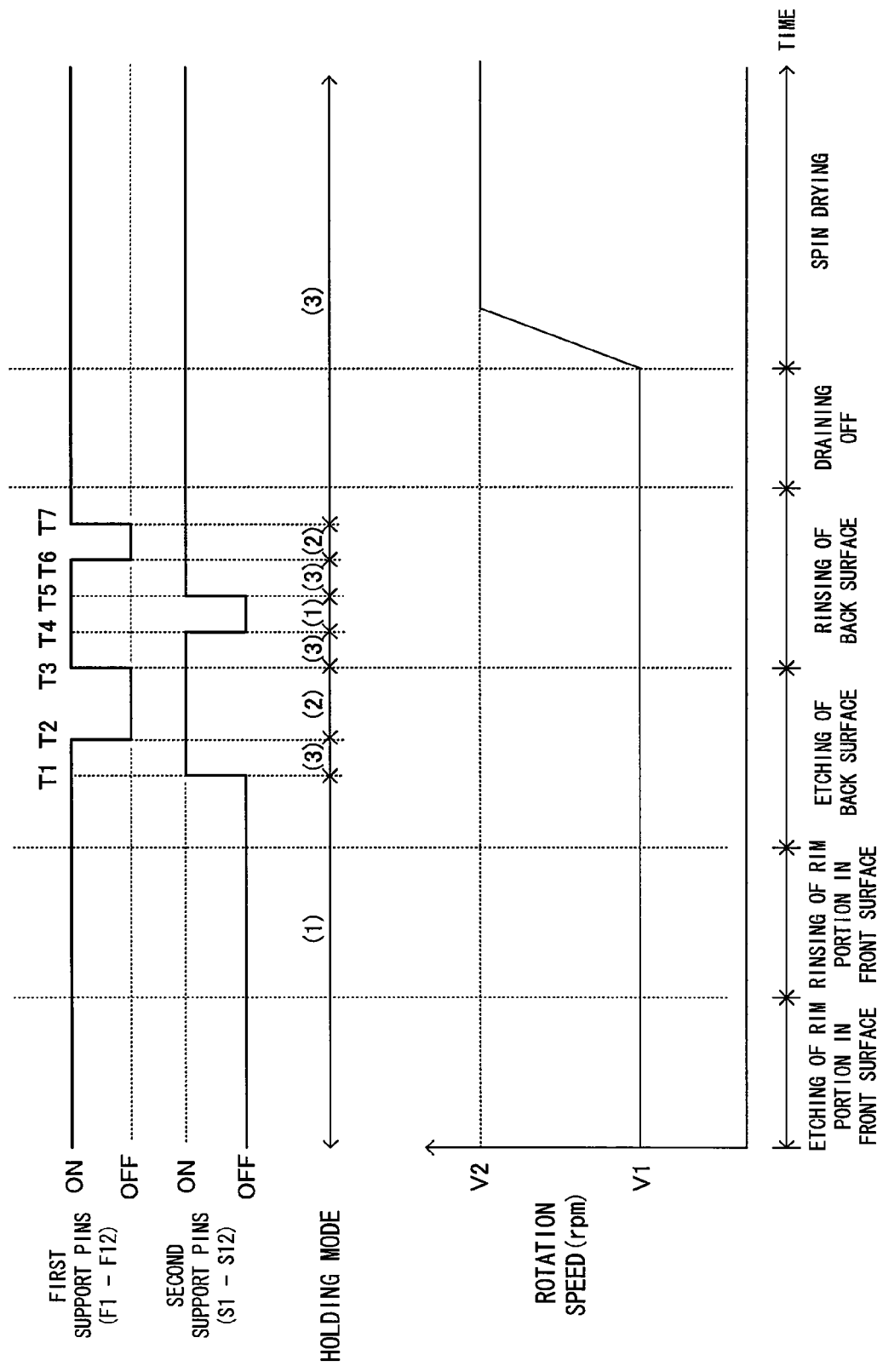

SUBSTRATE PROCESSING METHOD AND SUBSTRATE PROCESSING APPARATUS

CROSS REFERENCE TO RELATED APPLICATION

The disclosure of Japanese Patent Application No. 2005-366298 filed Dec. 20, 2005 including specification, drawings and claims is incorporated herein by reference in its entirety.

BACKGROUND OF THE INVENTION

1. Field of the Invention

The present invention relates to a substrate processing apparatus for and a substrate processing method of performing predetermined processing, such as cleaning, on semiconductor wafers, glass substrates for photomask, glass substrates for liquid crystal display, substrates for disk substrates, etc.

2. Description of the Related Art

A manufacturing process of treating a substrate such as a semiconductor wafer through a series of process steps includes a film formation step of forming a thin film such as a photo resist on the front surface of the substrate. The film formation step may sometimes result in forming a film on the back surface of the substrate or in a rim portion of the front surface of the substrate. However, it is generally only a circuit fabrication area in a central section of the front surface of the substrate that needs film formation on the substrate. If a film is formed on the back surface or in a rim portion of the front surface of the substrate, contact with other apparatus could strip off the thin film formed in the rim portion of the surface of the substrate at subsequent steps which follow the film formation step. This could lead to a lowered yield, a trouble within a substrate processing apparatus, etc.

For removal of a thin film in a rim portion of the front surface of a substrate, the apparatus described in Japanese Unexamined Patent Application Publication No. 2004-111902 for instance has been proposed. In this apparatus, a substrate seating a thin film on its front surface is set such that the substrate is directed toward above. Further, plural (six) holding members such as chuck pins is disposed to meet the rim of the substrate hold the substrate. The substrate rotates as it is held in this manner by the plural holding members. A chemical solution is supplied as a processing liquid to the back (the bottom) surface of the rotating substrate. A blocking member having an opposed surface faced against the front (the top) surface of the substrate is disposed so as to be spaced apart over a predetermined gap from the front surface of the substrate. As the blocking member and the substrate rotate, the chemical solution not only spreads all over the entire back surface of the substrate and etches away an unwanted substance but also flows over to the rim portion of the front surface of the substrate via the edge surface of the substrate and etches away even an unwanted substance which adheres to this rim portion. In a similar fashion, when pure water is made flow over to the rim portion of the front surface of the substrate as the processing liquid, this rim portion is rinsed.

This apparatus permits splitting the six holding members disposed at the rim of a substrate into two holding member groups, namely, a first holding member group formed by three first holding members and a second holding member group formed by three second holding members. The holding member groups are controlled independently of each other. The first holding member group and the second holding member group abut on the substrate alternately, ensuring that the first holding member group or the second holding member group always hold the substrate. This prevents occurrence of processing failure such as etching failure and rinsing failure. In short, the apparatus has three holding modes, namely, (1) a first state that the first holding member group holds the substrate but the second holding member group does not hold the substrate, (2) a second state that the first and the second holding member groups hold the substrate, and (3) a third state that the second holding member group holds the substrate but the first holding member group does not hold the substrate. The holding mode is changed from the first to the third through the second. This attains complete processing of each area of the rim portions of the substrate with the processing liquid. After etching of the thin film only on the back surface and in the rim portions of the front surface of the substrate, the substrate rotates at a high speed, thereby draining the front and the back surfaces of the substrate off of moisture and drying (spin drying) the substrate.

SUMMARY OF THE INVENTION

In the apparatus described in Japanese Unexamined Patent Application Publication No. 2004-111902, as the state of holding a substrate is switched between the two holding member groups during execution of the processing with the processing liquid, it is possible to process the substrate even at abutting positions where the holding members hold the substrate. There however is the following problem since the holding members hold the substrate at the rim. That is, even though the substrate holding modes is switched between the two holding member groups, the holding members hold the substrate at the rim. Therefore, the processing liquid flowing over to the rim portion of the front surface of the substrate via the edge surface of the substrate from the back surface reaches the holding members. This varies the amount of the processing liquid thus flowing over to the rim portion and splashes the processing liquid. This changes the amount of the processing liquid flowing over to the rim portion between areas within the rim portions in the surfaces of the substrate where the holding members hold the substrate and areas where the holding members do not hold the substrate. This makes it difficult to process over a uniform processing width from the edge surface toward inside. In other words, for processing of the substrate with supply of the processing liquid to the substrate, it is desirable that no member would abut on the edge surface of the substrate for the purpose of preventing splashing of the processing liquid. Meanwhile, for drying of the substrate which rotates at a high speed, in an attempt to securely hold the substrate, it is desirable that there are such sections like the holding members which are capable of abutting on the edge surface of the substrate. Despite this, the conventional apparatus described above does not provide proper substrate holding modes which meet the operation of substrate processing, which in turn makes it impossible to favorably process a substrate in accordance with the operation of the substrate processing.

The invention has been made in light of the problems described above, and accordingly, an object of the invention is to provide a substrate processing apparatus and a substrate processing method with which it is possible to favorably process a substrate in accordance with the content of substrate processing.

According to an aspect of the present invention, there is provided a substrate processing apparatus for and a substrate processing method of performing predetermined processing on a substrate while rotating the substrate approximately horizontally. The apparatus comprises: a rotating part which is capable of freely rotating; a rotator which rotates the rotating part; a first supporter including at least three or more first support members each of which is capable of freely ascending to above the rotating part and descending and has a support portion, the first support members ascending and abutting the support portions on a bottom surface of the substrate so as to support the substrate approximately horizontally; a second supporter including at least three or more second support members each of which is capable of freely ascending to above the rotating part and descending and has a support portion and a restricting portion which are formed in front end side, the second support members ascending, abutting the support portions on the bottom surface of the substrate so as to support the substrate approximately horizontally and locating the restricting portions closer to the rim of the substrate than the support portions so as to abut on the edge surface of the substrate and accordingly restrict horizontal movement of the substrate; an ascend/descend section which makes the first support members and the second support members ascend and descend; a pressing section which is capable of pressing the substrate toward the first support members and/or the second support members upon supply of gas to a top surface of the substrate; and a controller which controls the ascend/descend section and the pressing section, thereby selectively switching between a first holding mode and a second holding mode in accordance with the content of processing of the substrate, the first holding mode being a mode in which the first support members support the substrate, the pressing section presses the substrate toward the first support members and makes the rotating part hold the substrate, the second holding mode being a mode in which the second support members support the substrate, the pressing section presses the substrate toward the second support members and makes the rotating part hold the substrate. The method comprises: a mode switching step of selectively switching a holding mode between a first holding mode and a second holding mode in accordance with the content of processing of the substrate, the first holding mode being a mode in which while at least three or more first support members, which are disposed to a rotating part which rotates so that they are directed toward above the rotating part, abut on the bottom surface of the substrate and support the substrate, gas supplied to the top surface of the substrate presses the substrate toward the first support members and makes the rotating part hold the substrate, the second holding mode being a mode in which while at least three or more second support members, which are disposed to a rotating part which rotates so that they are directed toward above the rotating part, abut on the edge surface of the substrate as the substrate moves along the horizontal direction, thereby restricting horizontal movement of the substrate, and abut on the bottom surface of the substrate, thereby supporting the substrate, gas supplied to the top surface of the substrate presses the substrate toward the second support members and makes the rotating part hold the substrate.

In the structure according to the invention, as the gas is supplied to the top surface of the substrate while the support members abutting on the bottom surface of the substrate support the substrate, the substrate gets pressed against the support members and is made held by the rotating part. In a condition that there are no holding members such as chuck pins which contact the edge surface of the substrate, the substrate held by the rotating part rotates. Hence, it is possible to prevent inconvenience attributable to holding of the substrate at the edge surface of the substrate. In addition, according to the invention, it is possible to selectively switch over to the two holding modes which are different from each other in accordance with the content of substrate processing. This allows favorably processing a rotating substrate while rotating the substrate and always holding the substrate in an appropriate mode in accordance with the content of the substrate processing.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 7 is a plan view of the spin base as viewed from the back;

FIG. 8 is a drawing of structures of first support pins;

FIG. 13 is a drawing which shows a structure of a position correcting unit;

FIG. 15 is a drawing for describing an operation of the position correcting unit which is shown in FIG. 13;

FIG. 21 is a timing chart of an operation of the support pins; and

DETAILED DESCRIPTION OF THE PREFERRED EMBODIMENTS

Figure 1:
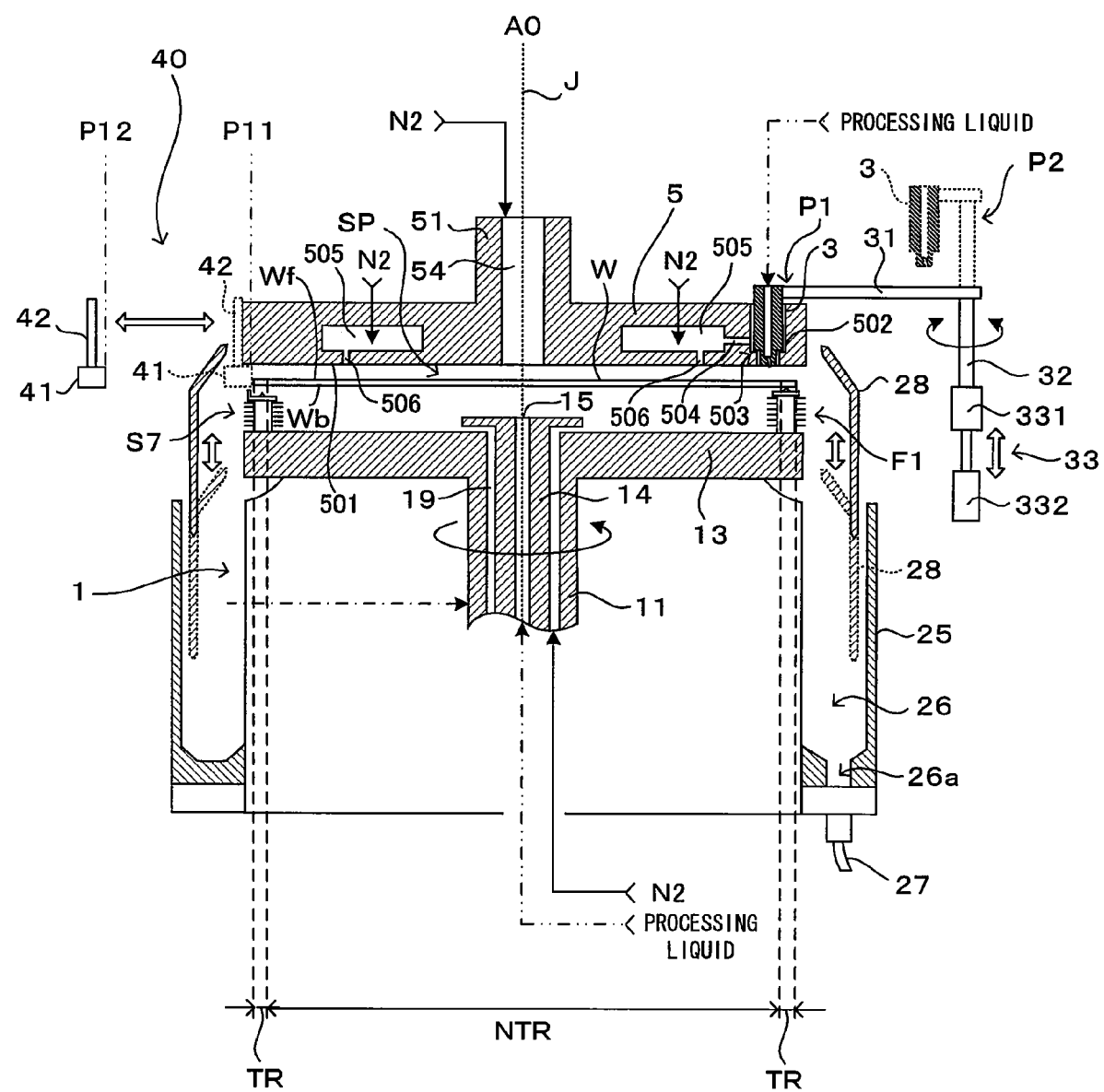
FIG. 1 is a drawing which shows a substrate processing apparatus according to an embodiment of the invention.
Figure 2:
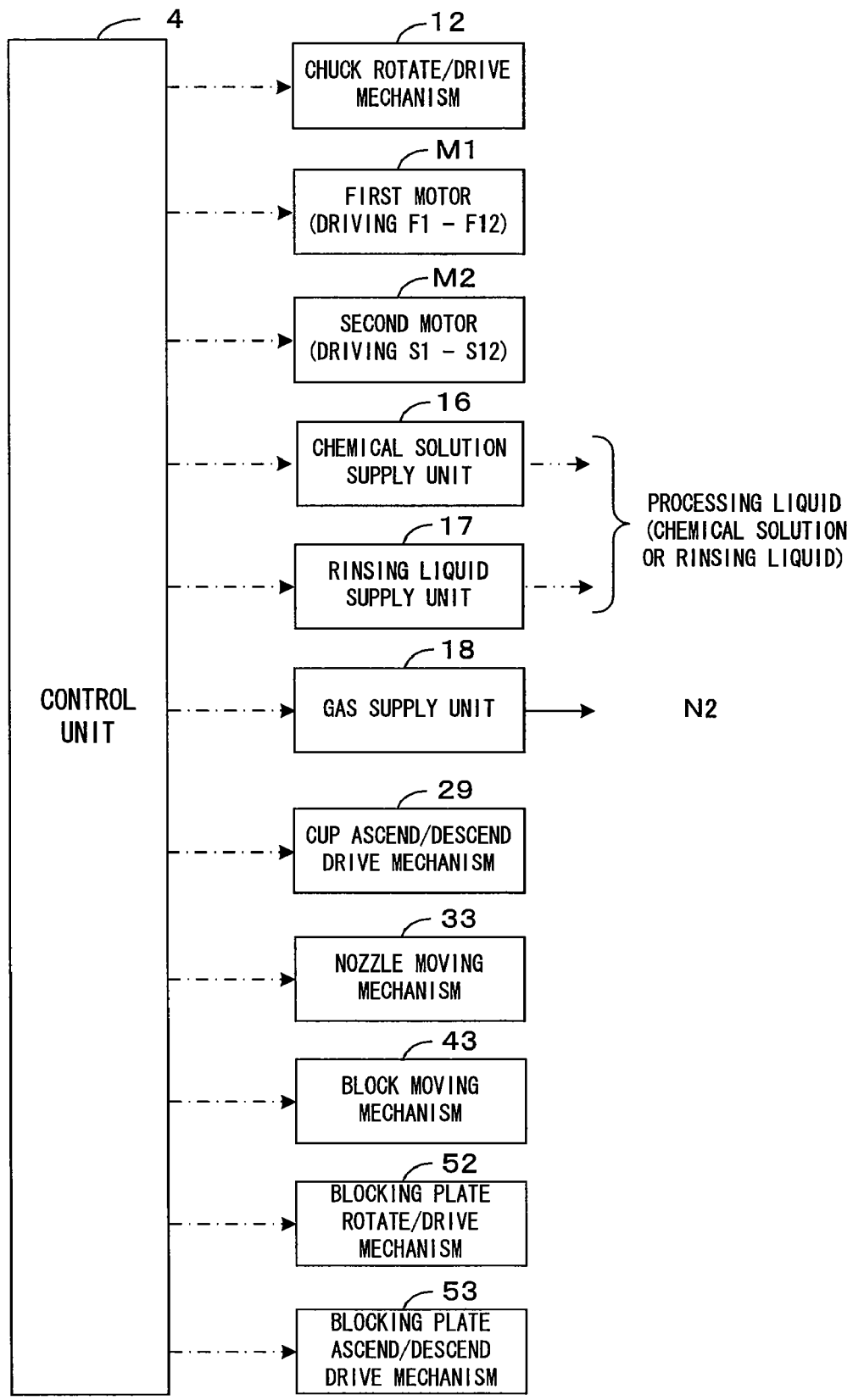
FIG. 2 is a block diagram which shows a control structure of the substrate processing apparatus of FIG. 1.

FIG. 1 is a drawing which shows a substrate processing apparatus according to an embodiment of the invention. FIG. 2 is a block diagram which shows a control structure of the substrate processing apparatus of FIG. 1. This substrate processing apparatus is an apparatus in which a thin film such as a metal layer and a photo resist layer is etched away from a rim portion within a front surface Wf of a substrate which may be a semiconductor wafer or the like. To be more specific, the apparatus supplies a chemical solution and a rinsing liquid (hereinafter referred to as "processing liquids") to a rim portion TR of a substrate W whose front surface Wf (device formation surface) seats a thin film. The chemical solution includes a chemical substance, an organic solvent or the like. The rinsing liquid may be pure water or DIW. The supply of the processing liquids results in etching and removal of the thin film from the rim portion TR of the front surface. The apparatus further supplies the processing liquid to a back surface Wb of the substrate and cleans the back surface Wb as a whole.

This substrate processing apparatus comprises a spin chuck 1, a bottom surface processing nozzle 15, a blocking plate 5 and a rim processing nozzle 3. The spin chuck 1 holds the substrate W horizontally such that the substrate W directs its front surface Wf toward above. The bottom surface processing nozzle 15 supplies the processing liquid (a chemical solution, a rinsing liquid, etc.) to a central portion in the bottom surface (the back surface Wb) of the substrate W which is held by the spin chuck 1. The blocking plate 5 is disposed opposed against the top surface of the substrate W which is held by the spin chuck 1. The rim processing nozzle 3 supplies the processing liquid to the rim portion TR of the front surface of the substrate W which is held by the spin chuck 1. Further, in this substrate processing apparatus, a position correcting unit 40, which corrects the horizontal position of the substrate W, is disposed on the side of the spin chuck 1.

A hollow support rod 11 of the spin chuck 1 is linked to a rotation axis of a chuck rotate/drive mechanism 12 which includes a motor. The spin chuck 1 rotates at a predetermined rotation speed about the rotation axis J which extends along the vertical direction when driven by the chuck rotate/drive mechanism 12. Linked to a top end portion of the support rod 11 is a spin base 13 which is linked as one integrated unit by a fastening component such as a screw. The spin base 13 therefore rotates about the rotation axis J when driven by the chuck rotate/drive mechanism 12 in response to an operation command received from a control unit or controller 4 which controls the apparatus as a whole. In this embodiment, the chuck rotate/drive mechanism 12 thus corresponds to the "rotator" of the invention and the spin base 13 thus corresponds to the "rotating part" of the invention.

The chuck rotate/drive mechanism 12 incorporates a rotation position detector such as a rotary encoder which detects the rotation position or rotation angle of the spin base 13 measured from a predetermined reference position and feeds the rotation position to the control unit 4. Based on the signal sent from the rotation position detector, the control unit 4 drives the chuck rotate/drive mechanism 12, thereby aligning the spin base 13 to a desired rotation position.

A processing liquid supply pipe 14 is inserted in the hollow support rod 11, and the bottom surface processing nozzle 15 is coupled with the top end of the processing liquid supply pipe 14. The processing liquid supply pipe 14, connected with a chemical solution supply unit 16 and a rinsing liquid supply unit 17, selectively supplies the chemical solution and the rinsing liquid. Further, the clearance between an inner wall surface of the support rod 11 and an outer wall surface of the processing liquid supply pipe 14 defines a cylindrical gas supply path 19. The gas supply path 19 is connected with a gas supply unit 18 (gas supply part) and capable of supplying nitrogen gas to a space which is created between the bottom surface of the substrate W and an opposed surface of the spin base 13. Although the gas supply unit 18 supplies nitrogen gas in this embodiment, the gas supply unit 18 may supply air, other inert gas, etc.

Figure 3:
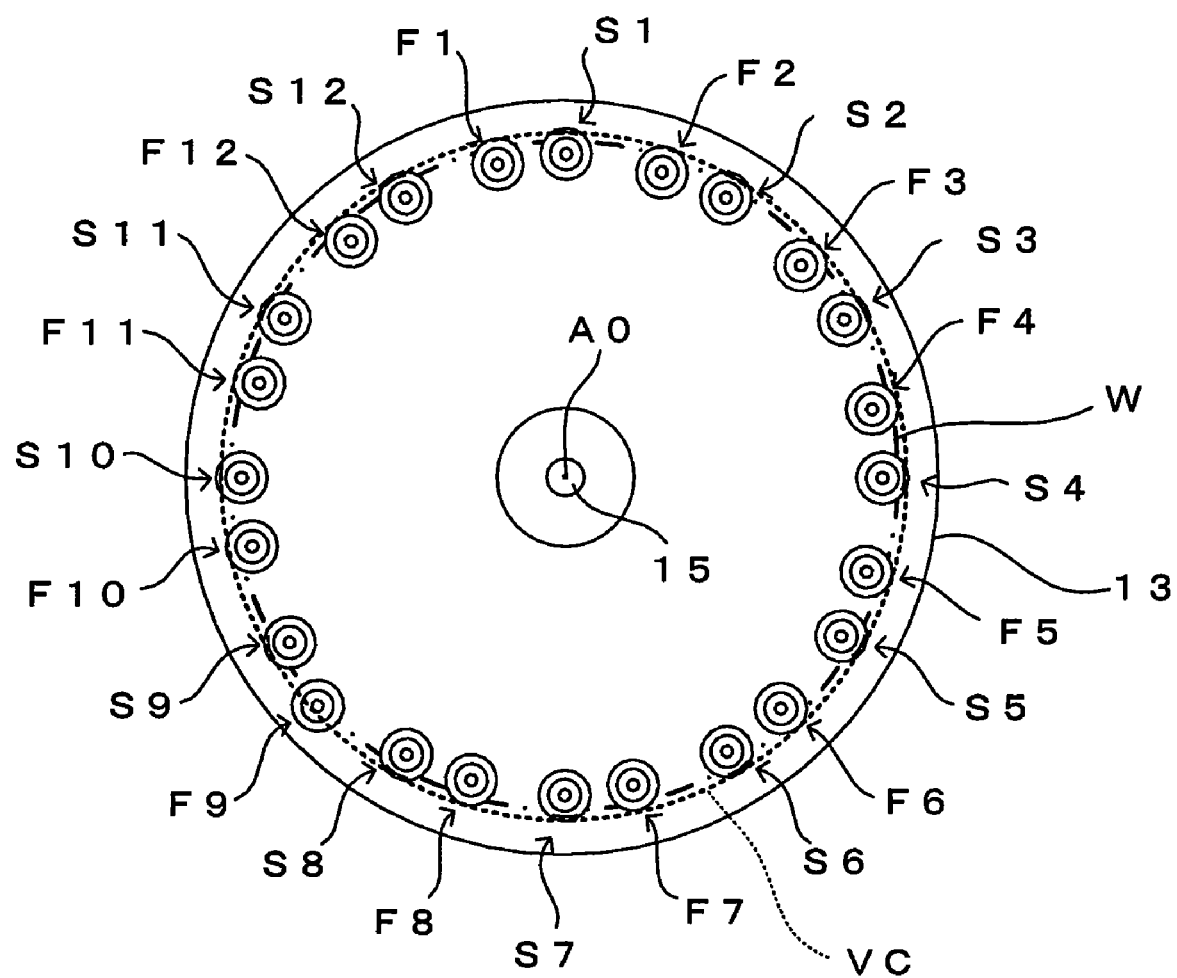
FIG. 3 is a plan view of a spin base as viewed from above.

FIG. 3 is a plan view of the spin base as viewed from above. There is an opening in a central portion of the spin base 13, and near a rim portion of the spin base, plural (twelve in this embodiment) first support pins F1 through F12 and plural (twelve in this embodiment) second support pins S1 through S12 are disposed such that they are capable of freely ascending and descending along the vertical direction. The first support pins F1 through F12 functions as the first support members of the invention while the second support pins S1 through S12 functions as the second support members of the invention. The first support pins F1 through F12 are disposed projecting toward above from the spin base 13 in a radial arrangement about the center of rotation A0 such that they are apart from each other by approximately equal angular spaces. While the second support pins S1 through S12 are disposed projecting toward above from the spin base 13 in a radial arrangement about the center of rotation A0 such that they are apart from each other by approximately equal angular spaces and they are located between the first support pins F1 through F12 along the circumferential direction. In short, twelve pairs of the support pins, each of which is one first support pin and one second support pin which are paired, are disposed in a radial arrangement about the center of rotation A0 along the circumferential direction in the rim portion of the spin base 13 such that they project toward above.

Abutting on the back surface Wb of the substrate, the first support pins F1 through F12 and the second support pins S1 through S12 are each capable of supporting the substrate W approximately horizontally so that the substrate W is spaced apart by a predetermined distance toward above from the spin base 13. Of these, the twelve first support pins F1 through F12 disposed between every other second support pins along the circumferential direction form the first support pin group (first supporter). In their operation, the first supporter supports in a concerted manner the substrate W or moves away from the back surface Wb of the substrate W and releases the substrate W from holding. Meanwhile, the remaining twelve second support pins S1 through S12 form the second support pin group (second supporter). In their operation, the second supporter supports in a concerted manner the substrate W or moves away from the back surface Wb of the substrate W and releases the substrate W from holding. While there may be at least three support pins in each support pin group in order to support the substrate W horizontally, as the number of the support pins in each support pin group is twelve, it is possible to support the substrate W more stably.

In addition, the number of the first support pins in the first support pin group is equal to the number of the second support pins in the second support pin group. Hence, even at the time that the first support pin group and the second support pin group switch to each other in supporting the substrate W (i.e., at the time of supporting the substrate and releasing the substrate), the switch goes well without hampering the stable support of the substrate.

Figure 4:
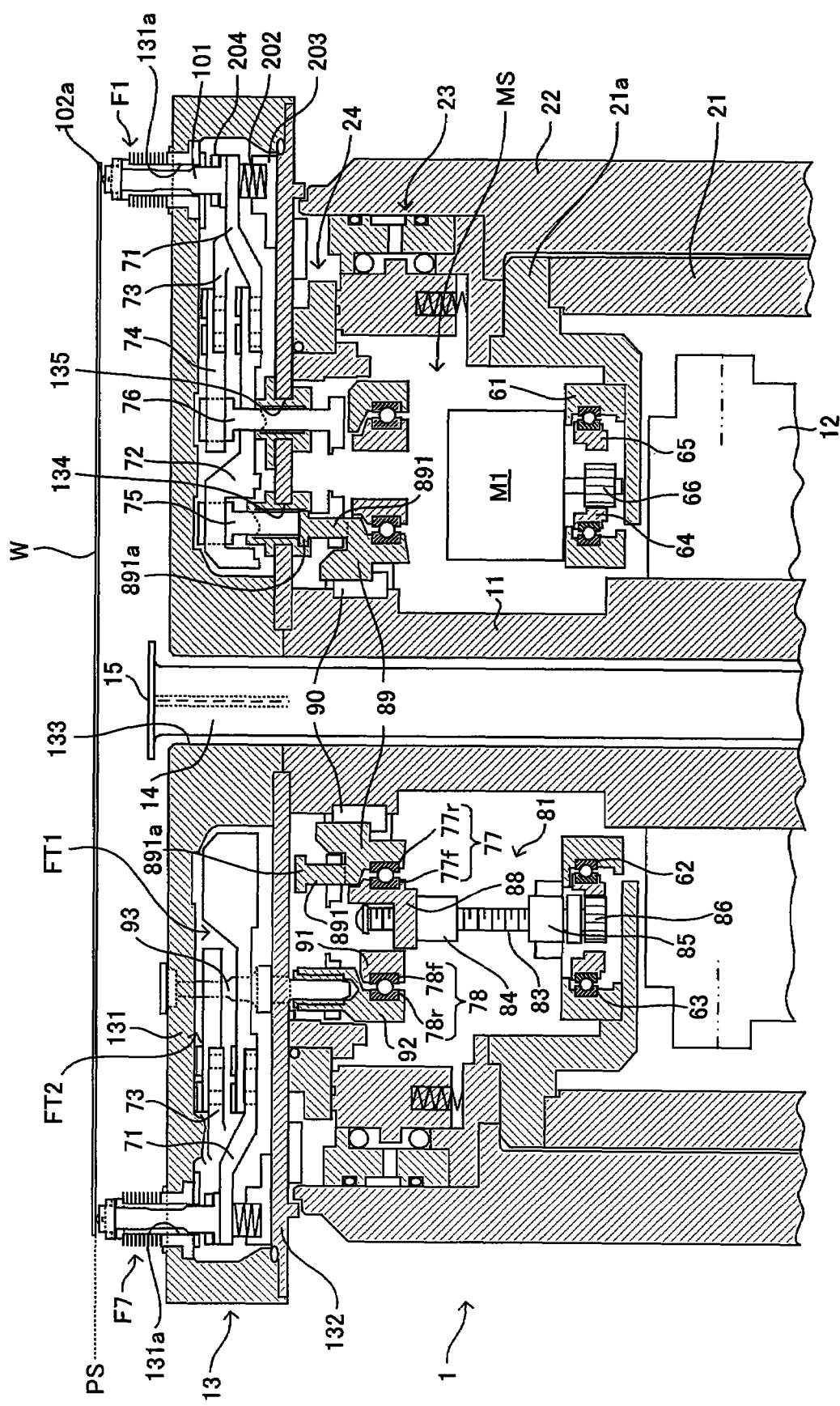
FIGS. 4 and 5 are cross sectional views for describing a structure relevant to a spin chuck.
Figure 5:
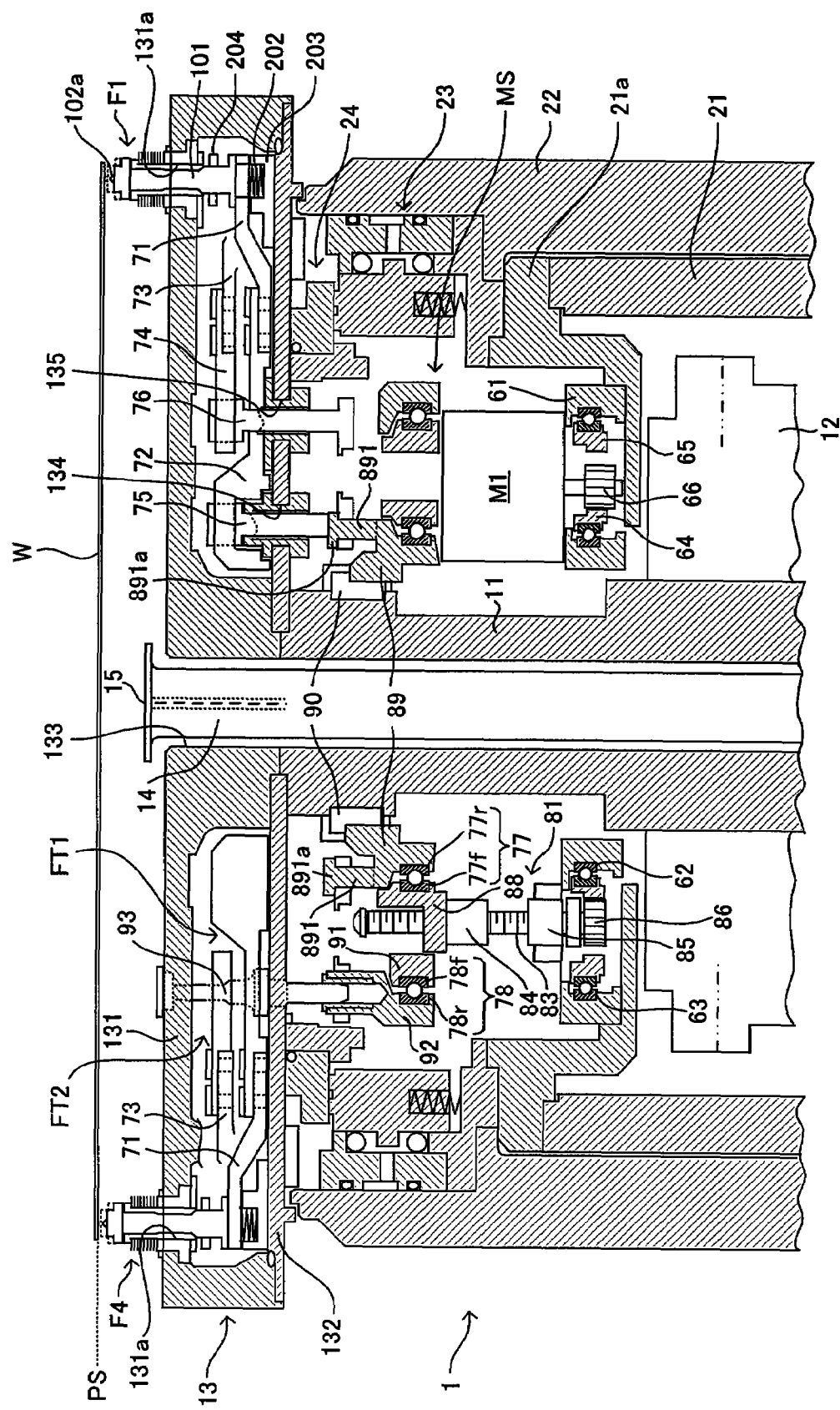
Figure 6A:
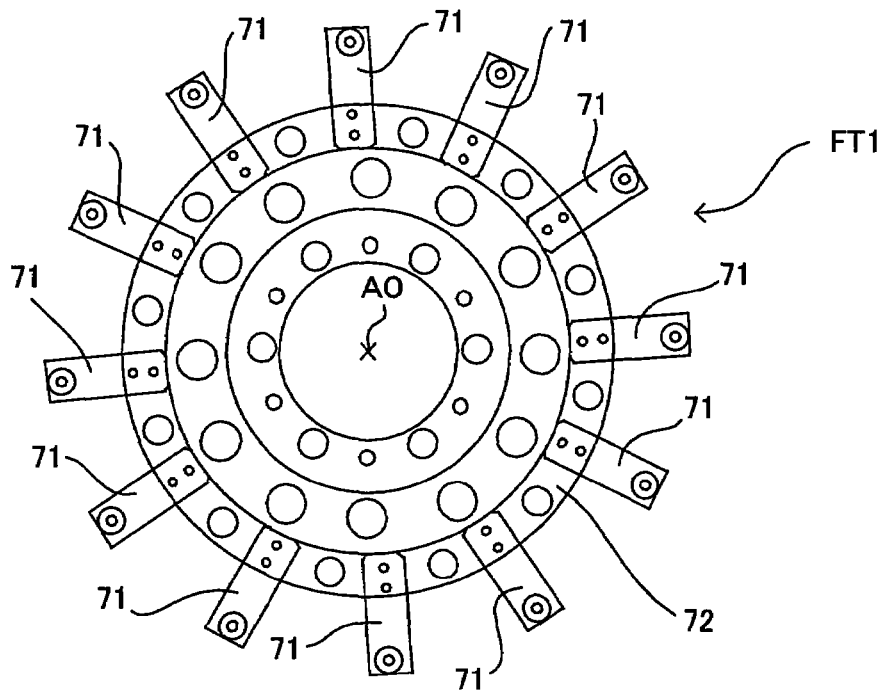
FIGS. 6A and 6B are plan views for describing a structure of an operation transmitting mechanism.
Figure 6B:
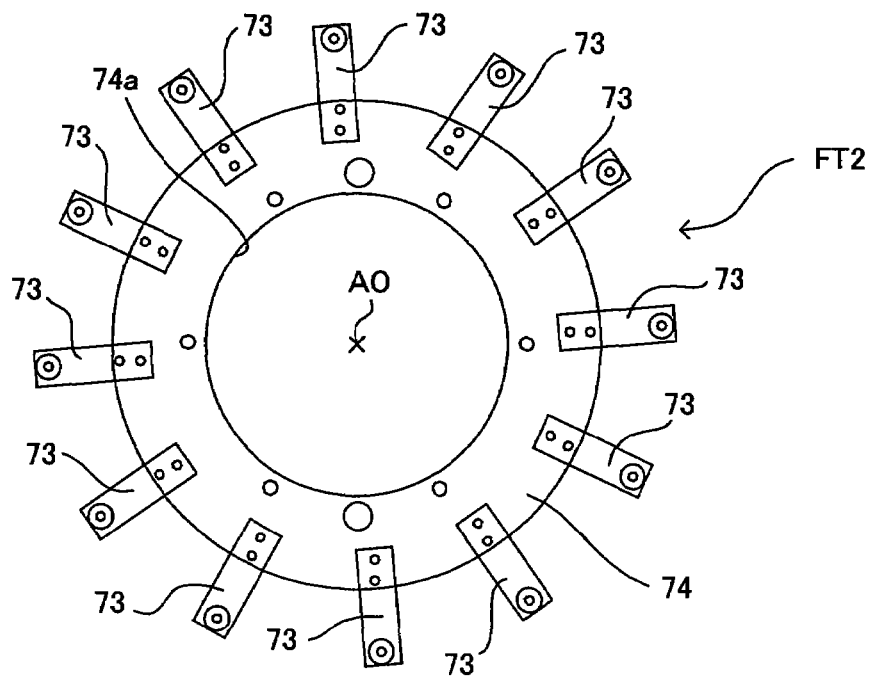

FIGS. 4 and 5 are cross sectional views (FIG. 10 taken along A-A') for describing a structure relevant to the spin chuck 1. FIG. 4 shows the support pins as they have ascended, whereas FIG. 5 shows the support pins as they have descended. FIGS. 6A and 6B are plan views for describing the structure of a power transmitting mechanism which is disposed within the spin base. Although FIGS. 4 and 5 show only how the first support pins ascend and descend in concert with each other, the second support pins are also capable of ascending and descending similarly to the first support pins.

The spin chuck 1 comprises a first power transmitting mechanism FT1 which makes the first support pins F1 through F12 ascend and descend in concert with each other and a second power transmitting mechanism FT2 which makes the second support pins S1 through S12 ascend and descend in concert with each other. The first power transmitting mechanism FT2 includes twelve top-to-bottom arms 71 which respectively make the first support pins F1 through F12 operate and a first top-to-bottom ring 72 which makes the top-to-bottom arms 71 ascend and descend in concert with each other as shown in FIG. 6A. A fastening component such as a screw links each top-to-bottom arm 71 to the associated first top-to-bottom ring 72 such that the top-to-bottom arms 71 extend along the radius direction in a radial arrangement and are spaced apart by equal angular spaces (30 degrees) from each other about the center of rotation A0. The first support pins F1 through F12 are disposed upright at the front ends of the respective top-to-bottom arms 71. In a similar manner, the second power transmitting mechanism FT2 includes twelve top-to-bottom arms 73 which respectively make the second support pins S1 through S12 operate and a second top-to-bottom ring 74 which makes the top-to-bottom arms 73 ascend and descend in concert with each other as shown in FIG. 6B. A fastening component such as a screw links each top-to-bottom arm 73 to the associated second top-to-bottom ring 74 such that the top-to-bottom arms 73 extend along the radius direction in a radial arrangement and are spaced apart by equal angular spaces (30 degrees) from each other about the center of rotation A0, and the second support pins S1 through S12 are disposed upright at the front ends of the respective top-to-bottom arms 73.

The first top-to-bottom ring 72 and the second top-to-bottom ring 74 are almost ring-shaped members which are disposed in a concentric arrangement about the center of rotation A0 of the spin base 13. As an opening 74a formed at the center of the second top-to-bottom ring 74 is large, the second top-to-bottom ring 74 is located above the first top-to-bottom ring 72 as if to surround a part of the first top-to-bottom ring 72 inside the opening 74a (FIGS. 4 and 5). The first and the second top-to-bottom rings 72 and 74 are capable of ascending and descending along the rotation axis J (vertical axis) of the spin base 13. As the first top-to-bottom ring 72 moves up and down, the first support pins F1 through F12 ascend and descend en masse. In the meantime, as the second top-to-bottom ring 74 moves up and down, the second support pins S1 through S12 ascend and descend all together.

The spin base 13 is formed as a top plate 131 and a bottom plate 132 is fixed with a bolt. The rim portion of the spin base 13 has through holes 131a which accept the first support pins F1 through F12 and the second support pins S1 through S12 in such a manner that the support pins can freely ascend and descend. Further, between the top plate 131 and the bottom plate 132, a reception space is created which houses the first and the second power transmitting mechanisms FT1 and FT2. A through hole 133 into which the spin base 13 is inserted is formed in central portions of the top plate 131 and the bottom plate 132. The processing liquid supply pipe 14 is disposed such that it runs through this through hole 133 and penetrates through the support rod 11 of the spin chuck 1. To the top end of the processing liquid supply pipe 14, the bottom surface processing nozzle 15 is fixed which is opposed against the center of the bottom surface of the substrate W which is held by the spin chuck 1.

FIG. 7 is a plan view of the spin base as viewed from the back. The first and the second top-to-bottom rings 72 and 74 engage respectively with a first and a second interlocking rings 75 and 76 which move the first and the second top-to-bottom rings 72 and 74 toward above and below. The first and the second interlocking rings 75 and 76 are ring-shaped members which are disposed in a concentric arrangement about the center of rotation A0. The second interlocking ring 76 is disposed outside the first interlocking ring 75. The first and the second interlocking rings 75 and 76 are formed extending along the up/down direction relative to the bottom plate 132 via through holes 134 and 135 which are formed in the bottom plate 132 of the spin base 13. Their top ends engage with the first and the second top-to-bottom rings 72 and 74. The first and the second interlocking rings 75 and 76 are capable of ascending and descending along the rotation axis J. As the first interlocking ring 75 moves up and down, the first support pins F1 through F12 ascend and descend via the first top-to-bottom ring 72. Meanwhile, as the second interlocking ring 76 moves up and down, the second support pins S1 through S12 ascend and descend via the second top-to-bottom ring 74.

The structures of the first support pins F1 through F12 and the second support pins S1 through S12 will now be described with reference to FIGS. 8, 9A and 9B. FIG. 8 is a drawing of the structure of the first support pins. Since the first support pins F1 through F12 are identical in structure, the structure of one first support pin will be described. The first support pin F1 includes a movable main member 101, a support member 102, a bellow 103 and a ring member 105. The movable main member 101 is disposed upright on the associated top-to-bottom arm 71. The support member 102 is disposed on the movable main member 101 and structured so as to abut on the rim portion of the bottom surface of the substrate W and support the substrate W. The bellow 103 is inserted to the top plate 131 of the spin base 13 as if to surround the movable main member 101. The ring member 105 is attached above the bellow 103 and has a top surface on which the support member 102 can be seat.

A screw hole 101a accepting the support member 102 is formed at the top of the movable main member 101. Fit in the screw hole 101a, the support member 102 sets itself on the movable main member 101. The support member 102 is a screw-shaped member. A screw head part (thread) in an upper area of the support member 102 abuts as a support portion 102a on the bottom surface of the substrate W and supports the substrate, while a screw part in a lower area fits with the screw hole 101a of the movable main member 101. A top end portion 103a of the bellow 103 engages with the movable main member 101 as if to cover the apex of the movable main member 101 (i.e., a rim portion of the screw hole 101a). This protects the movable main member 101 and prevents a liquid from intruding into inside the spin base 13 through the through hole 131a. The bellow 103 is made of PTFE (polytetrafluoroethylene) for example, and during processing of the substrate W with the chemical solution or the like, protects the movable main member 101 which is made of stainless steel (SUS), aluminum, etc. In addition, there is a seal member 201 disposed between the top plate 131 of the spin base 13 and an edge part of the bellow 103, thereby blocking the internal space inside the spin base 13 from the external atmosphere.

The ring member 105 is a ring-shaped member whose opening matches with the diameter of the screw part of the support member 102. The ring member 105 is mounted on the top end portion 103a of the bellow 103 and fixed as the support member 102 is screwed into the screw hole 101a of the movable main member 101. A seal member 104 is disposed between the screw part of the support member 102 and the ring member 105, which prevents a liquid from flowing into the screw hole 101a of the movable main member 101 from between the support member 102 and the ring member 105. For the sake of chemical resistance, the support member 102 and the ring member 105 are preferably made of PCTFE (polychlorotrifluoroethylene). On the contrary, if it is not necessary to take chemical resistance into consideration, they may be made of a rubber-based material.

Mounted to the bottom plate 132 of the spin base 13 below the first support pin F1 is a spring case 203 in which a helical compression spring 202 is disposed with its expansion/contraction direction extending along the vertical direction. This urges the first support pin F1 upward via the associated top-to-bottom arm 71, and as a result, the support portion 102a of the first support pin F1 abuts on the bottom surface of the substrate W and the first support pin F1 is positioned at a support position PS where it supports the substrate W as shown in FIG. 4. With respect to the position along the height direction of the first support pin F1, as a stopper 204 fixed inside the spin base 13 fits with a flange part 101b at the bottom of the movable main member 101, the upper limit position of the first support pin F1 is restricted. Meanwhile, when the first support pin F1 moves downward in a manner described later, the top end surface 203a of the spring vase 203 serves as a stopper, and as the bottom end of the top-to-bottom arm 71 fits with the top end surface 203a of the spring vase 203, the lower limit position of the first support pin F1 is restricted as shown in FIG. 5.

Figure 9A:
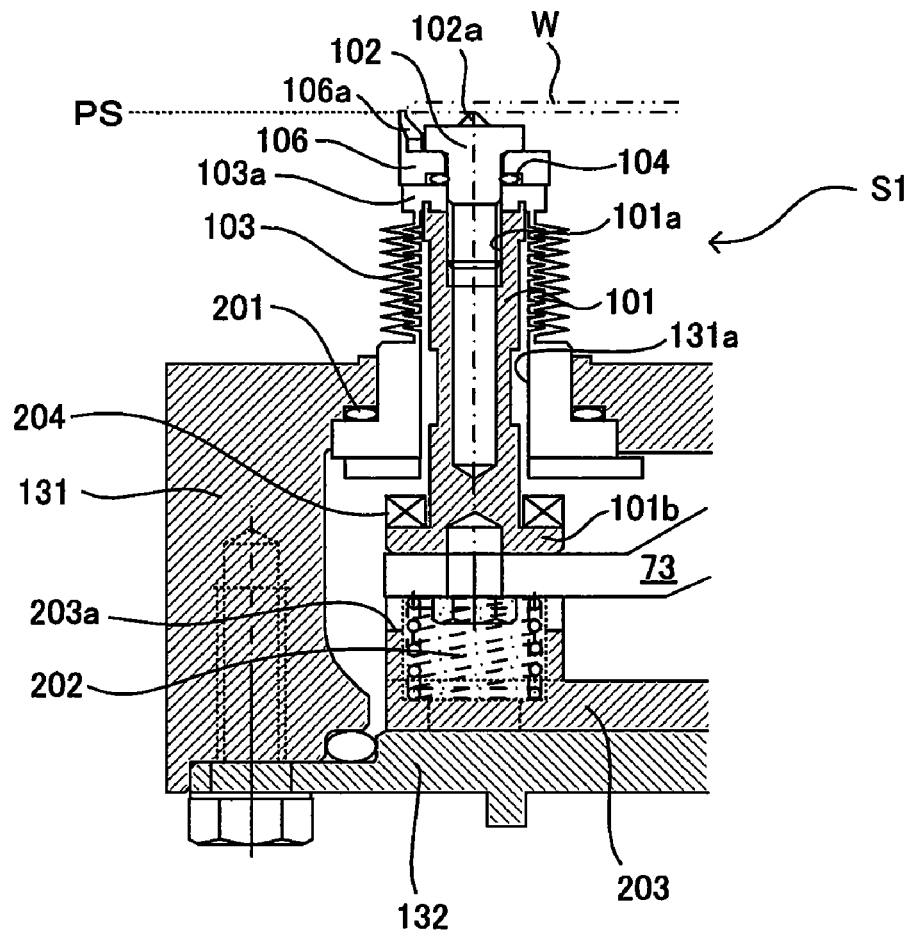
FIGS. 9A and 9B are drawing of structures of second support pins.
Figure 9B:
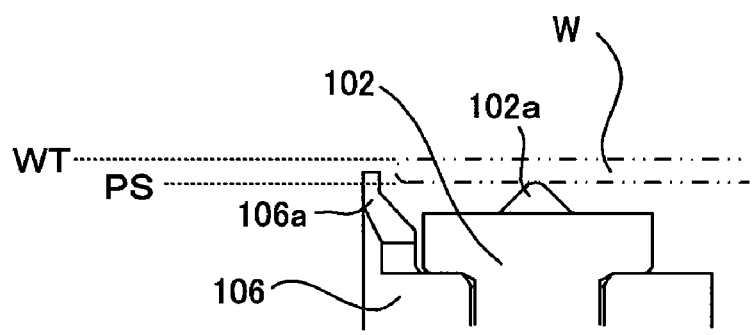

FIGS. 9A and 9B are drawing of the structure of the second support pins. The first support pins F1 through F12 and the second support pins S1 through S12 are common in that they are structured so as to abut on the bottom surface of the substrate W and support the substrate W. The second support pins S1 through S12 however are different in that they can restrict horizontal movement of the substrate W which is supported by the support portions 102a. Noting this, the difference of the second support pins S1 through S12 from the first support pins F1 through F12 alone will be described. The same aspects of the structure as those of the first support pins F1 through F12 will be merely denoted at the same reference symbols but will not be described in redundancy. The second support pins S1 through S12 are identical to each other in terms of structure.

The second support pins S1 through S12 are finished so that ring members 106 inserted between the bellows 103 (the top end portions 103a) and the support members 102 can abut on the edge surface of the substrate W. In other words, the ring members 106 include restricting portions 106a which are located closer to the rim of the substrate relative to the support members 102, and the restricting portions 106a are capable of abutting on the edge surface of the substrate W and restricting horizontal movement of the substrate W. As each one of the second support pins S1 through S12 has such a restricting portion 106a, however the substrate W supported by the support portions 102a moves along the horizontal direction, the edge surface of the substrate W contacts the ring members 106. This prevents the substrate W from jumping out along the radius direction.

The restricting portions 106a of the second support pins S1 through S12 are formed so that they are opposed against the edge surface of the substrate W which is supported by the support portions 102a and so that they are spaced apart from the edge surface of the substrate over a predetermined gap. Describing in more detail, the restricting portions 106a are formed so that the diameter of a virtual circle VC (FIG. 3) linking the restricting portions 106a of the second support pins S1 through S12 to each other slightly exceeds the diameter of the substrate W. Hence, to make it possible for the second support pins S1 through S12 to support the substrate W, substrate position correcting processing which will be described later must ensures that the horizontal position of the substrate W is inside the virtual circle VC.

Further, as shown in FIG. 9B, the height of the restricting portions 106a is set lower than the position along the height direction WT of the top surface of the substrate W which is supported by the support portions 102a. This structure prevents the blocking plate described later 5 from contacting the restricting portions 106a even when the blocking plate 5 is disposed close to and opposed against the top surface (the front surface Wf) of the substrate W. It is also possible to suppress jumping of the processing liquid flowing outward along the radius direction of the substrate W and out from the substrate W back to the substrate W while the processing liquid is supplied to the substrate W.

The other features of the structure of the second support pins are similar to those of the first support pins. While the second support pins S1 through S12 are disposed upright to the front ends of the respective top-to-bottom arms 73, the position along the height direction of the stopper 204 on which the top-to-bottom arms 73 abut when ascended is the same as the height direction of the stopper 204 which stays below the first support pin F1. The second support pins S1 through S12 are thus capable of abutting on the bottom surface of the substrate W at the same support positions PS as those for the first support pins F1 through F12 and supporting the substrate W.

Describing continuously with reference back to FIGS. 4 and 5, the support rod 11 is integrated with a drive shaft of the motor of the chuck rotate/drive mechanism 12, penetrating the chuck rotate/drive mechanism 12. A casing 21 is disposed which surrounds the chuck rotate/drive mechanism 12. A cylindrical cover member 22 surrounds the casing 21. The top end of the cover member 22 extends even to near the bottom surface of the spin base 13, and there is a seal mechanism 23 disposed to an inner surface of the cover member 22 which is close to the top end of the cover member 22. The seal mechanism 23 slides against a seal member 24 which is fixed to the bottom surface of the spin base 13. This creates a mechanism housing space MS, which is blocked from the external atmosphere, between the seal mechanism 23 and the support rod 11.

In addition, as shown in FIG. 1, a receiver member 25 is fixed around the cover member 22. The space between an external wall surface of the cover member 22 and an internal wall surface of the receiver member 25 defines a drainage bath 26 whose bottom section has a drainage outlet 26a which links to a collection drain 27. The processing liquids (the chemical solution and the rinsing liquid) drained at the collection drain 27 are re-used or disposed as needed.

Disposed above the drainage bath 26 is a cylindrical splashing preventing cup 28 which can freely ascend and descend and surround the spin chuck 1 and the substrate W which is held by the spin chuck 1. The cylindrical splashing preventing cup 28 is disposed for the purpose of preventing the processing liquid supplied to the substrate W and then removed off from the substrate W from getting splashed. As a cup ascend/descend drive mechanism 29 drives in accordance with an operation command received from the control unit 4, the cylindrical splashing preventing cup 28 moves upward and downward along the rotation axis J. In short, when the cylindrical splashing preventing cup 28 remains at an upper position (the position denoted at the solid line in FIG. 1), the cylindrical splashing preventing cup 28 surrounds the spin chuck 1 and the substrate W which is held by the spin chuck 1 and collects the processing liquid supplied to and jumping at the substrate W. Meanwhile, when a transportation unit not shown needs mount the substrate W not processed yet upon the support pins on the spin base or receive the substrate W already processed from the support pins, the cylindrical splashing preventing cup 28 is driven to move to a lower position (the position denoted at the dotted line in FIG. 1).

Figure 10:
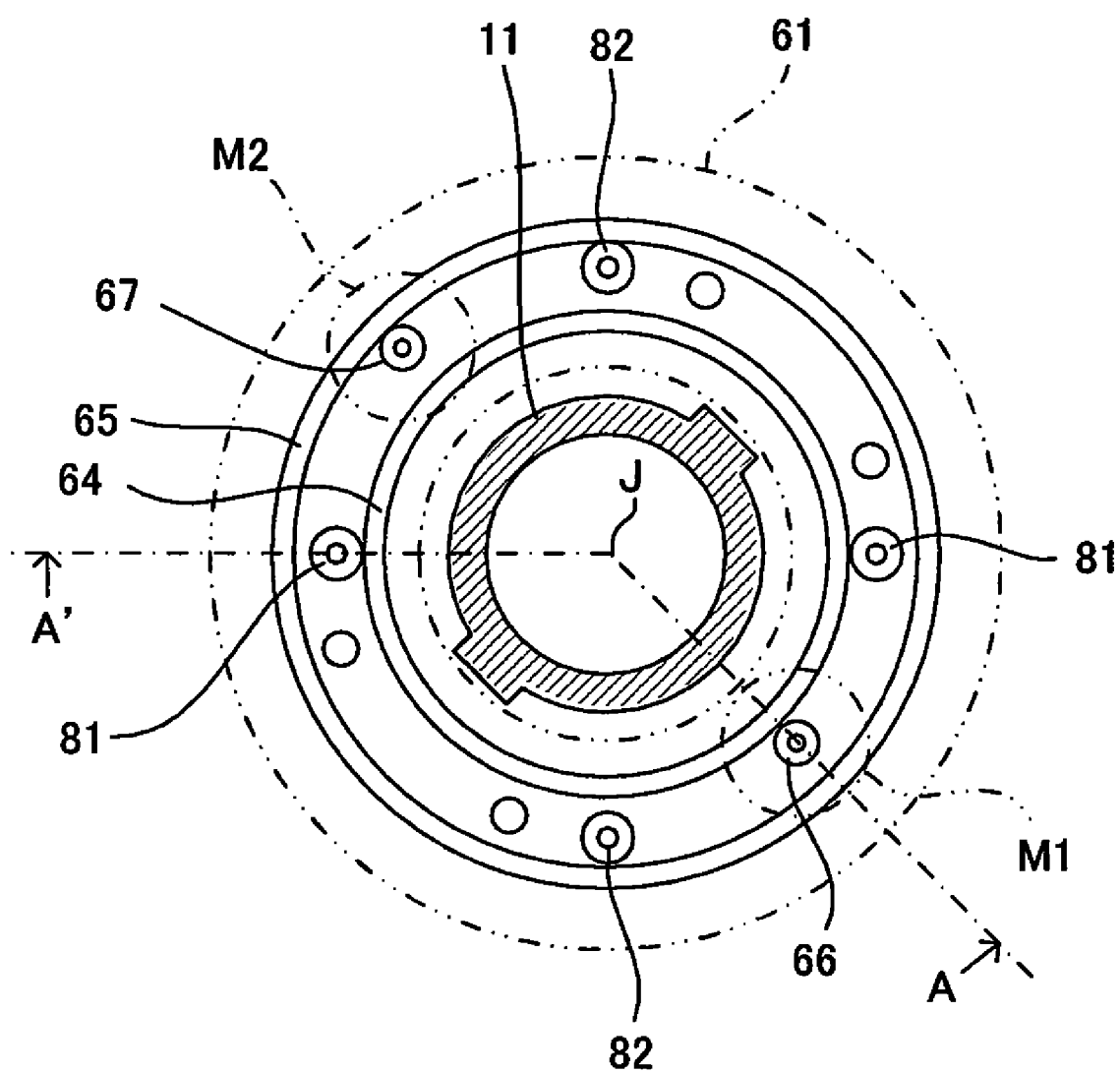
FIG. 10 is a plan view for describing a structure of a drive mechanism which drive the first and the second support pins.

FIG. 10 is a plan view for describing the structure of drive mechanisms which drive the first and the second support pins. Inside the mechanism housing space MS, a gear case 61 which is approximately ring-shaped and surrounds the support rod 11 is attached on a top lid portion 21*a* of the casing 21. As shown in the plan view in FIG. 10, a first motor M1 and a second motor M2 are fixed respectively as the "first ascend/descend part" and the "second ascend/descend part" of the invention on the gear case 61 at symmetrical positions to the support rod 11. Further, the motors M1 and M2 function as the "ascend/descend section" of the invention. Bearings 62 and 63 are press fitted respectively into an inner-side internal wall part and an outer-side internal wall part of the gear case 61, as shown in FIGS. 4 and 5. The bearings 62 and 63 are disposed coaxial relative to the support rod 11. A ring-like first gear 64 surrounding the support rod 11 is fixed to a rotation-side ring of the inner bearing 62. To a rotation-side ring of the outer bearing 63, a ring-like second gear 65 surrounding the support rod 11 is fixed. Hence, inside the gear case 61, the first gear 64 and the second gear 65 can rotate coaxially to the support rod 11, and the second gear 65 is located toward outside than the first gear 64. The first gear 64 has its gear teeth at the outer circumference, while the second gear 65 has its gear teeth at the inner circumference.

A pinion 66 fixed to the drive shaft of the first motor M1 is located between the first gear 64 and the second gear 65 and engages with the first gear 64 which is on the inner side. In a similar manner, as shown in FIG. 10, a pinion 67 fixed to the drive shaft of the second motor M2 is located between the first gear 64 and the second gear 65 and engages with the second gear 65 which is on the outer side. Further, on the gear case 61, paired first ball screw mechanisms 81 are disposed at positions avoiding the motors M1, M2 and opposed against each other across the support rod 11 (that is, on the side closer to the support rod 11). Still further, on the gear case 61, other paired second ball screw mechanisms 82 are disposed at positions avoiding the motors M1, M2 and the first ball screw mechanisms 81 and opposed against each other across the support rod 11 (that is, on the side closer to the support rod 11).

The first ball screw mechanisms 81 comprise screws 83 which are parallel to the support rod 11 and ball nuts 84 which engage with the screws 83 as shown in FIGS. 4 and 5. The screws 83 are attached to the top lid portion of the gear case 61 via bearing portions 85, and the bottom ends of the screws 83 reach even the inside of the gear case 61. Gears 86 are fixed to the bottom ends of the screws 83. The gears 86 are located between the first gear 64 and the second gear 65 and engage with the first gear 64 which is disposed on the inner side.

On the other hand, a first non rotation-side movable member 88 is attached to the ball nuts 84. The first non rotation-side movable member 88 is a ring-shaped member surrounding the support rod 11, and non rotation-side rings 77*f* of first bearings 77 disposed surrounding the support rod 11 are fixed to the inner circumferential surface of the first non rotation-side movable member 88. Rotation-side rings 77*r* of the first bearings 77 are disposed on the inner side relative to the support rod 11 than the non rotation-side rings 77*f* are. The rotation-side rings 77*r* are fixed on the outer circumferential side of a first rotation-side movable member 89 which is ring-shaped and surrounds the support rod 11. The first rotation-side movable member 89 fits with a guide rail 90 which projects from the outer circumferential surface of the support rod 11. The guide rail 90 is formed along a direction which is parallel to the support rod 11. Guided in a direction along the support rod 11, the first rotation-side movable member 89 therefore is linked with the support rod 11 in such a manner that the first rotation-side movable member 89 is movable.

As the first motor M1 drives and the pinion 66 rotates, torque is transmitted to the first gear 64. This rotates the gear 86 engaging with the first gear 84, and hence, rotates the screws 83 of the ball screw mechanisms 81. As a result, the ball nuts 84 and the first non rotation-side movable member 88 linked with the ball nuts 84 ascend or descend along the support rod 11. Since the first rotation-side movable member 89 which is supposed to rotate together with the support rod 11 is linked with the first non rotation-side movable member 88 via the first bearings 77, as the first non rotation-side movable member 88 ascends or descends, the first rotation-side movable member 89 ascends or descends along the guide rail 90 even when the support rod 11 is still rotating.

Other ring-like second non rotation-side movable member 91 is disposed on the outer side relative to the ring-like first non rotation-side movable member 88 which is moved up and down by the first ball screw mechanisms 81. While the second ball screw mechanisms 82 have similar structures to those of the first ball screw mechanisms 81 described above, a gear disposed at the bottom ends of the screws of the second ball screw mechanisms engages with the second gear 65 from the inner side between the first gear 64 and the second gear 65 inside the gear case 61. Hence, when the second motor M2 drives the pinion 67 similarly engaging with the second gear 65, the ball nuts (not shown) of the second ball screw mechanisms 82 ascend and descend. The ball nuts are linked with the second non rotation-side movable member 91.

Fixed to the outer circumferential surface of the second non rotation-side movable member 91 are non rotation-side rings 78*f* of second bearings 78 which are disposed surrounding the support rod 11. Rotation-side rings 78*r* of the second bearings 78 are fixed to the inner circumferential surface of a ring-like second rotation-side movable member 92 which surrounds the support rod 11. On the top surface of the second rotation-side movable member 92, two torque transmitting pins 93 are inserted at approximately symmetrical positions to the support rod 11 across the support rod 11, in the vertical direction which is along the support rod 11 (FIG. 7). The torque transmitting pins 93 are fixed to the spin base 13, penetrating the top plate 131 and the bottom plate 132 of the spin base 13, and fit at their bottom ends with the second rotation-side movable member 92 while maintaining the second rotation-side movable member 92 freely capable of ascending and descending. When the second non rotation-side movable member 91 ascends or descends together with the ball nuts of the second ball screw mechanisms 82, the second rotation-side movable member 92 linked via the second bearings 78 as well ascends or descends at the same time. The second rotation-side movable member 92 rotates together with the spin base 13 (that is, together with the support rod 11) since the second rotation-side movable member 92 is linked to the spin base via the torque transmitting pins 93 in such a manner that the second rotation-side movable member 92 can ascend or descend. Further, the second rotation-side movable member 92, owing to the drive force from the second ball screw mechanisms 82, can ascend or descend even when thus rotating.

Four top-to-bottom drive pins 891 extending along the vertical direction engaging with the first interlocking ring 75 are disposed above the first rotation-side movable member 89. To be more specific, the first interlocking ring 75 has notches 751 which can engage with the top-to-bottom drive pins 891, in association with the respective top-to-bottom drive pins 891 as shown in FIG. 7. The top-to-bottom drive pins 891 are inserted in the respective notches 751. As the first rotation-side movable member 89 moves down, shoulder portions 891a of the top-to-bottom drive pins 891 engage with the first interlocking ring 75, that is, the four top-to-bottom drive pins 891 pull down the first interlocking ring 75, whereby the first interlocking ring 75 descends as shown in FIG. 5. In consequence, the first top-to-bottom ring 72 engaged with the first interlocking ring 75 and the top-to-bottom arms 71 linked to the first top-to-bottom ring 72 move down all together against the urging force of the helical compression spring 202 which is disposed below the top-to-bottom arms 71. Hence, the first support pins F1 through F12 disposed upright to the respective top-to-bottom arms 71 descend.

The descending operation of the second support pins S1 through S12 is also approximately similar to that of the first support pins F1 through F12. In other words, the second interlocking ring 76 has insertion holes 761 in which top-to-bottom drive pins (not shown) can fit in association with the top-to-bottom drive pins of the second rotation-side movable member 92, and the top-to-bottom drive pins are inserted in the respective insertion holes 761. As the second rotation-side movable member 92 descends, the top-to-bottom drive pins fit with the second interlocking ring 76 and the second interlocking ring 76 descends. As a result, against the urging force of the helical compression spring 202 which is disposed below the top-to-bottom arms 73, the second top-to-bottom ring 74 engaged with the second interlocking ring 76 and the top-to-bottom arms 73 linked with the second top-to-bottom ring 74 move down all together. This permits the second support pins S1 through S12 which are disposed upright to the respective top-to-bottom arms 73 descend.

Hence, as the first and the second motors M1 and M2 drive and rotate in response to an operation command received from the control unit 4, the first support pin group consisting of the first support pins F1 through F12 and the second support pin group consisting of the second support pins S1 through S12 can ascend and descend simultaneously or independently of each other. This makes it possible to support the substrate W in the following three modes. That is, in a condition that the first and the second motors M1 and M2 provide no driving, the first and the second support pins F1 through F12 and S1 through S12 all are at the support positions PS so that it is possible to support the substrate W with the first support pin group and the second support pin group. Further, when the first motor M1 drives, the first support pins F1 through F12 move downward and away from the bottom surface of the substrate W so that it is possible to support the substrate W only with the second support pins S1 through S12. In contrast, when the second motor M2 drives, the second support pins S1 through S12 move downward and away from the bottom surface of the substrate W so that it is possible to support the substrate W only with the first support pins F1 through F12.

Describing continuously with reference back to FIG. 1, the disk-shaped blocking plate 5 opposed against the spin base 13 is disposed horizontally as the "plate-shaped member" of the invention above the spin chuck 1. The blocking plate 5 is attached to the bottom end portion of a support rod 51 which is disposed coaxial to the support rod 11 of the spin chuck 1 in such a manner that the blocking plate 5 can rotate as an integrated part of the support rod 51. Linked to the support rod 51 is a blocking plate rotate/drive mechanism 52. As a motor for the blocking plate rotate/drive mechanism 52 drives in response to an operation command received from the control unit 4, the blocking plate 5 rotates about the rotation axis J. As the control unit 4 controls so as to synchronize the motor for the blocking plate rotate/drive mechanism 52 to the motor for the chuck rotate/drive mechanism 12, the blocking plate 5 rotates at the same rotation speed and in the same rotation direction as those of the spin chuck 1. In this embodiment, the blocking plate rotate/drive mechanism 52 thus functions as the "plate-shaped member rotating part" of the invention.

Further, the blocking plate 5 is connected with a blocking plate ascend/descend drive mechanism 53. Therefore, when an ascend/descend drive actuator (which may be an air cylinder for instance) for the blocking plate ascend/descend drive mechanism 53 activates, the blocking plate 5 moves closer and becomes opposed against the spin base 13 or moves away from the spin base 13. Describing in more detail, activating the blocking plate ascend/descend drive mechanism 53, the control unit 4 makes the blocking plate 5 ascend to a retract position which is above the spin chuck 1, for loading of the substrate W into and unloading of the substrate W from the substrate processing apparatus or correction of the position of the substrate W by means of the position correcting unit 40 which will be described later. On the contrary, for cleaning of the substrate W at a substrate processing position (which is the height-direction position of the substrate W which is supported at the support pins which are positioned at the support positions PS) which is spaced apart upward by a predetermined distance from the spin base 13, the blocking plate 5 descends to a predetermined opposed position (the position shown in FIG. 1) which is very close to the front surface Wf of the substrate W which is held by the spin chuck 1. This sets the bottom surface of the blocking plate 5 (opposed surface 501) and the front surface Wf of the substrate opposed against each other but spaced apart from each other.

An opening formed at the center of the blocking plate 5 and a hollow section of the support rod 51 define a gas supply path 54. The gas supply path 54 is connected with the gas supply unit 18, which makes it possible to supply nitrogen gas to a space SP which is created between the top surface (front surface Wf) of the substrate W and the opposed surface 501 of the blocking plate 5.

Figure 11:
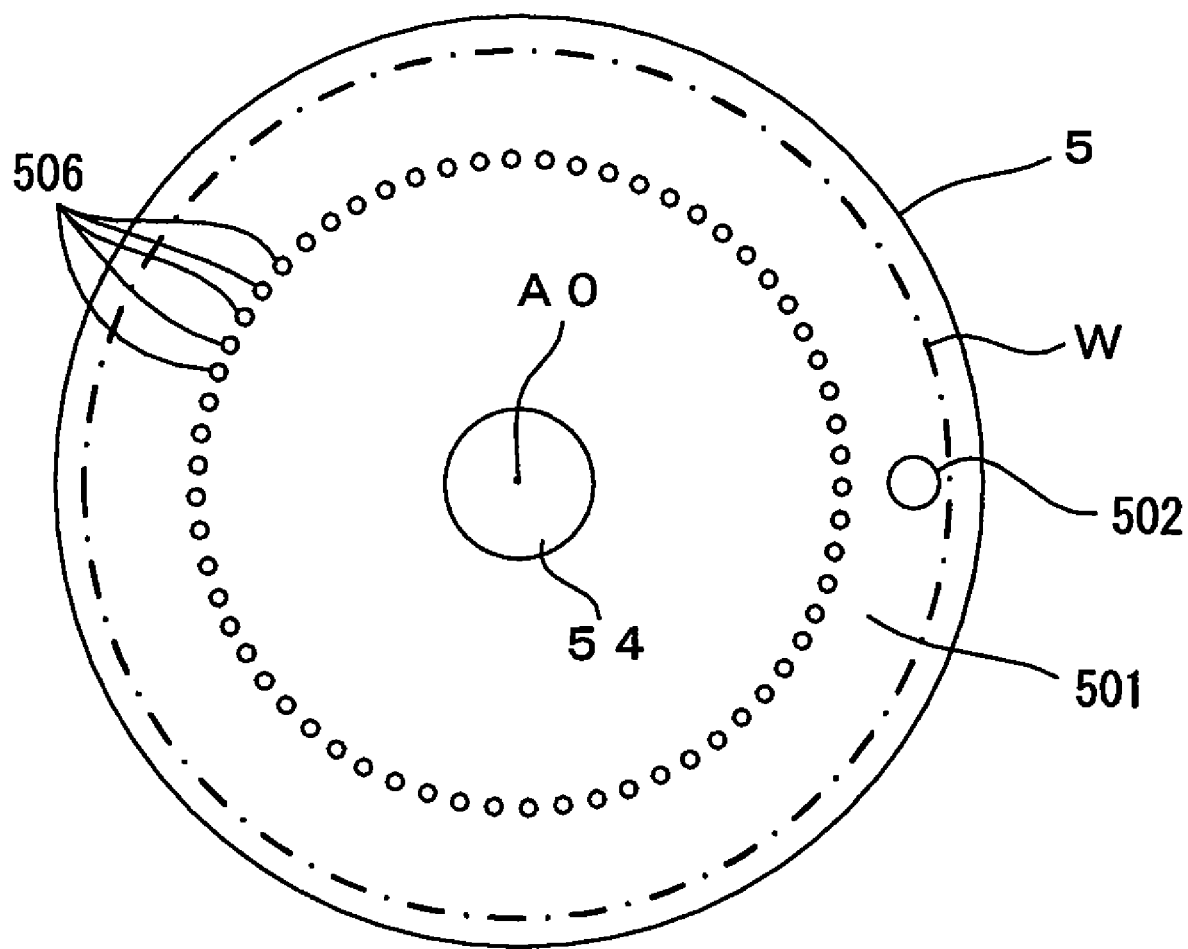
FIG. 11 is a bottom plan view of a blocking plate.

FIG. 11 is a bottom plan view of the blocking plate 5. The bottom surface (base end surface) of the blocking plate 5 serves as the opposed surface 501 which is opposed against and approximately parallel to the top surface (front surface Wf) of the substrate W. The plan area size of this surface is equal to or larger than the diameter of the substrate W. Hence, when the blocking plate 5 comes to the opposed position, the blocking plate 5 covers the entire front surface of the substrate W and block the atmosphere above the front surface Wf of the substrate W from the external atmosphere. Further, a rim portion of the blocking plate 5 includes a through hole 502 which penetrates the blocking plate 5 from the top to the bottom (i.e., along the direction of the vertical axis) and has an approximately cylindrical internal space so that the through hole 502 can accept the rim processing nozzle 3 which will be described later. Since the through hole 502 is formed at a position which is opposed against the rim portion TR of the front surface of the substrate W which is held by the spin chuck 1, insertion of the rim processing nozzle 3 into the through hole 502 positions the rim processing nozzle 3 opposed against the rim portion TR of the front surface.

Further, plural gas ejection outlets 506 are formed in the opposed surface 501. The plural gas ejection outlets 506 are formed at positions opposed against non-processing region NTR which is in a central part of the front surface of the substrate W which is held by the spin chuck 1 in such a manner that the gas ejection outlets 506 are spaced apart by equal angular spaces from each other about the center of rotation A0 along the circumference. The gas ejection outlets 506 link to a gas distributing space 505 inside the blocking plate 5. Supplied to the gas distributing space 505, nitrogen gas reaches the space SP through the gas ejection outlets 506. The gas ejection outlets may not necessarily be plural gas ejection outlets but may instead be a single opening, e.g., a ring-shaped opening which extends all along the circumference about the center of rotation A0. However, use of plural gas ejection outlets is more advantageous in ensuring a uniform gas ejecting pressure.

With the nitrogen gas supplied to the space SP, the internal pressure within the space SP enhances, which presses the substrate W against the support pins (the first support pins F1 through F12 and/or the second support pins S1 through S12) which abut on the bottom surface of the substrate W. As the chuck rotate/drive mechanism 12 rotates the spin base 13 therefore, due to friction force developing between the bottom surface of the substrate W and the support pins, the substrate W pressed against the support pins rotates together with the spin base 13 while supported at the support pins. In the space SP, thus supplied nitrogen gas flows outward along the radius direction from near the center of the substrate W. In this embodiment, the opposed surface 501 of the blocking plate 5, the gas ejection outlets 506, the gas supply path 54 and the gas supply unit 18 thus function as the "pressing section" of the invention.

Hence, as the control unit 4 controls the gas supply unit 18 so that the first and the second motors M1 and M2 drive and rotate while the gas supply unit 18 supplies nitrogen gas to the space SP, it is possible to selectively switch among the three holding modes in each of which the substrate W can be held (mode switching step). In short, the control unit 4 makes it possible to selectively switch among the three holding modes of:

(1) the first holding mode that the second support pins S1 through S12 descend and the first support pins F1 through F12 (the first support pin group) support the substrate W, and the nitrogen gas supplied to the space SP presses the substrate W toward the first support pins F1 through F12 and makes the spin base hold the substrate W;

(2) the second holding mode that the first support pins F1 through F12 descend and the second support pins S1 through S12 (the second support pin group) support the substrate W, and the nitrogen gas supplied to the space SP presses the substrate W toward the second support pins S1 through S12 and makes the spin base hold the substrate W; and (3) the third holding mode that while the first and the second support pins F1 through F12 and S1 through S12 (the first and the second support pin groups) support the substrate W, the nitrogen gas supplied to the space SP presses the substrate W toward the second support pins S1 through S12 and makes the spin base hold the substrate W.

The rim processing nozzle 3 will now be described. The rim processing nozzle 3 is fixed to one end of a nozzle arm 31. The other end of the nozzle arm 31 is axially supported at an arm shaft 32, and therefore, as the arm shaft 32 revolves, the rim processing nozzle 3 pivots about the arm shaft 32 within a predetermined angle range. In addition, a nozzle moving mechanism 33, which drives the nozzle arm 31 and the rim processing nozzle 3 fixed to the same as one integrated unit, is linked to the arm shaft 32. The nozzle moving mechanism 33 comprises a pivot drive source 331 such as a motor and an ascend/descend drive source 332 such as a cylinder. The source 331 pivots the rim processing nozzle 3 and the nozzle arm 31, while the source 332 moves the rim processing nozzle 3 and the nozzle arm 31 upward and downward. In this structure, the pivot drive source 331 can move the rim processing nozzle 3 horizontally parallel to the front surface Wf of the substrate and the ascend/descend drive source 332 can move the rim processing nozzle 3 upward and downward. As the nozzle moving mechanism 33 drives in response to an operation command received from the control unit 4 therefore, the rim processing nozzle 3 is inserted into the through hole 502 of the blocking plate 5 and moved to a processing position P1 (denoted at the solid line in FIG. 1) and a stepped-back position P2 (the position denoted at the dotted line in FIG. 1). At the position P1 it is possible to supply the processing liquid to the rim portion TR of the front surface, while at the position P2 the rim processing nozzle 3 stays away from the rim portion TR of the front surface.

Figure 12:
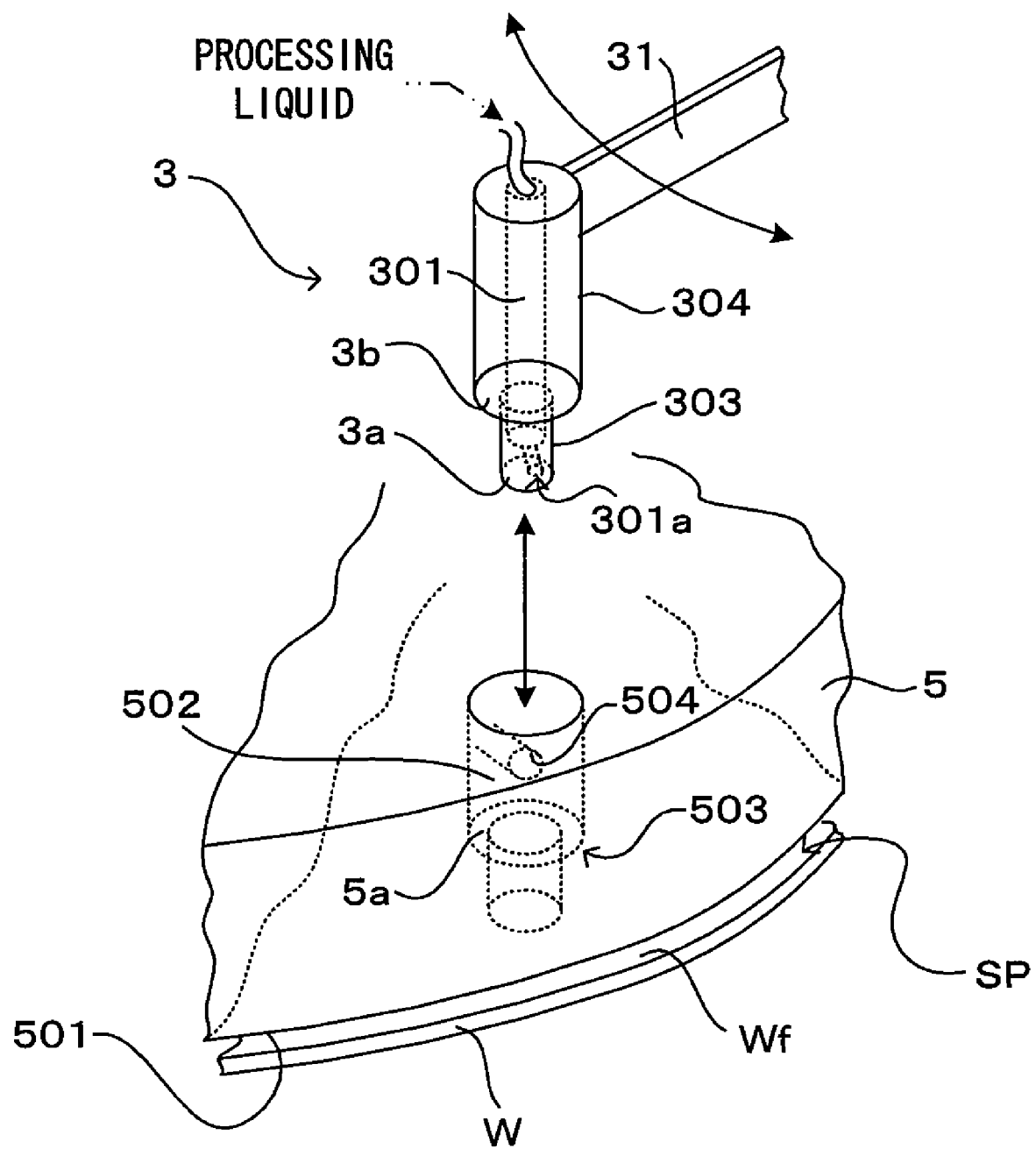
FIG. 12 is a drawing which shows structures of through holes which are formed in a rim processing nozzle and the blocking plate.

FIG. 12 is a drawing which shows the structure of the through holes which are formed in the rim processing nozzle and the blocking plate. The rim processing nozzle 3 is formed approximately cylindrical so as to match with the shape of the through hole 502 of the blocking plate 5. When the rim processing nozzle 3 is inserted into the through hole 502, the front end side of the rim processing nozzle 3 becomes opposed against the rim portion TR of the front surface (FIG. 1). A processing liquid supply path 301 is provided inside the rim processing nozzle 3, and the front end portion (bottom end portion) of the processing liquid supply path 301 defines an outlet 301a of the rim processing nozzle 3. During insertion of the rim processing nozzle 3 into the through hole 502, a front end surface 3a around the outlet 301a of the rim processing nozzle 3 gets inserted until it becomes flush with the opposed surface 501 of the blocking plate 5. Considering insertion into the through hole 502 of the blocking plate 5, the diameter of the rim processing nozzle 3 (the outer diameter of the nozzle) is approximately ϕ5 through 6 mm for instance so that the diameter of the through hole 502 does not have to be larger than needed.

The outlet 301a of the rim processing nozzle 3 is open toward the outside along the radius direction of the substrate W so that it is possible to selectively supply the chemical solution and the rinsing liquid at the outlet 301a toward the rim portion TR of the front surface. The processing liquid supply path 301 is connected with the chemical solution supply unit 16 and the rinsing liquid supply unit 17 via tubes or the like at the end of the nozzle, which realizes supply of the chemical solution or the rinsing liquid. Hence, when the chemical solution supply unit 16 pressure-feeds the chemical solution in response to an operation command received from the control unit 4, the chemical solution gushes out from the outlet 301a of the rim processing nozzle 3. The chemical solution reaches the rim portion TR of the front surface flows toward the outside along the radius direction of the substrate W and leaves the substrate W. The non-processing region NTR, which is located toward the inner side of the substrate than the position at which the chemical solution is supplied, receives no chemical solution. This results in etching of a thin film in the rim portion of the front surface Wf of the substrate over a constant width (peripheral etching width) from the edge surface of the substrate W toward inside. Meanwhile, when the rinsing liquid supply unit 17 pressure-feeds the rinsing liquid in response to an operation command received from the control unit 4, the rinsing liquid gushes out from the outlet 301a of the rim processing nozzle 3. The rinsing liquid reaches the rim portion TR of the front surface, flows toward the outside along the radius direction of the substrate W and leaves the substrate W.

The rim processing nozzle 3 is structured so that the cross sectional area size of its approximately cylindrical nozzle trunk part changes between an area closer to the front end of the nozzle and an area closer to the rear end of the nozzle. To be more specific, the cross sectional area size of a trunk part 303 closer to the front end of the nozzle is smaller than the cross sectional area size of a trunk part 304 closer to the rear end of the nozzle. The nozzle 3 has a stepped surface 3b between the trunk part 303 closer to the front end of the nozzle and the trunk part 304 closer to the rear end of the nozzle. That is, an outer surface (side surface) of the trunk part 303 closer to the front end of the nozzle is joined via the stepped surface 3b to the trunk part 303 closer to the front end of the nozzle. In the trunk part joining area, the stepped surface 3b is formed like a ring which goes around the periphery the trunk part 303 which is closer to the front end of the nozzle, and is also approximately parallel to the front surface Wf of the substrate W which is held by the spin chuck 1.

Considering chemical resistance, the rim processing nozzle 3 and the nozzle arm 31 are made of resin materials. To be more exact, the rim processing nozzle 3 is made of PTFE (polytetrafluoroethylene) and the nozzle arm 31 is made of PVC (polyvinyl chloride). The stepped surface 3b of the rim processing nozzle 3 may be obtained through cutting of the front end of the cylindrical nozzle which is made of the resin material mentioned above, for instance.

Meanwhile, the inner wall of the through hole 502 of the blocking plate 5 has a stepped portion 503 which is capable of abutting on the stepped surface 3b of the rim processing nozzle 3. The stepped portion 503 has a ring-shaped abutting surface 5a which abuts on the rim processing nozzle 3 when the rim processing nozzle 3 is positioned at the processing position P1. The abutting surface 5a is approximately parallel to the opposed surface 501 of the blocking plate 5, that is, to the front surface Wf of the substrate, and can therefore contact the stepped surface 3b of the rim processing nozzle 3. Due to this, as compared with where the stepped surface 3b and the abutting surface 5a are not formed parallel to the front surface Wf of the substrate, the following merits are obtained. That is, it is easier to process the outer shape of the rim processing nozzle 3 and the inner wall of the through hole 502, and therefore, it is possible to enhance the accuracy of the nozzle position relative to the substrate W during positioning of the rim processing nozzle 3 to the processing position P1. Further, during positioning of the rim processing nozzle 3 to the processing position P1, the stepped surface 3b of the rim processing nozzle 3 is pressed against the abutting surface 5a of the blocking plate 5. This makes the rim processing nozzle 3 abut on and fixed to the blocking plate 5, and hence, stably position at the processing position P1.

The inner wall of the through hole 502 of the blocking plate 5 further has a gas inlet part 504 from which nitrogen gas can be supplied to the space inside the through hole 502. The gas inlet part 504 links to the gas supply unit 18 via the gas distributing space 505 which is created inside the blocking plate 5. Therefore, when the gas supply unit 18 pressure-feeds nitrogen gas in response to an operation command received from the control unit 4, the nitrogen gas is supplied into the space inside the through hole 502. In consequence, the nitrogen gas gushes out at both the top and the bottom openings of the through hole 502 in a state that the rim processing nozzle 3 has moved to a stepped-back position P2 (the position denoted at the dotted line in FIG. 1), that is, in a state that the rim processing nozzle 3 is not inserted into the through hole 502.

The gas inlet part 504 is opened toward the direction away from the substrate W relative to the abutting surface 5a which is bored in the inner wall of the through hole 502, i.e., to the opposite side to the location of the substrate W from the abutting surface 5a. Hence, when the rim processing nozzle 3 is positioned to the processing position P1, the stepped surface 3b of the rim processing nozzle 3 abuts on the abutting surface 5a and a gas flow path toward the substrate W is blocked. This prevents the nitrogen gas from gushing into the space SP, which is between the front surface Wf of the substrate and the opposed surface 501, from the through hole 502 beyond this abutting section. The nitrogen gas introduced into the through hole 502 through the gas inlet part 504 is discharged from above the through hole 502, that is, through the opening which is on the opposite side to the substrate W.

The position correcting unit 40 will now be described with reference to FIGS. 13 through 15. This substrate processing apparatus includes, on the side to the spin chuck 1, the position correcting unit 40 which corrects the horizontal position of the substrate. For precise control of the width of etching (peripheral etching width) from the edge surface of the substrate W toward inside, it is important to coincide the center of rotation A0 of the spin base 13 with the center W0 of the substrate W. This is because it is impossible to process over a uniform peripheral etching width if the center W0 of the substrate is off (i.e., is eccentric relative to) the center of rotation of the spin base 13. In the event that there are three or more holding members such as chuck pins which firmly hold the substrate W at the periphery for instance, as each holding member abuts on the edge surface of the substrate W, the center of rotation of a rotating part such as the spin base 13 and the center of the substrate center are positioned within a predetermined range. On the contrary, but for holding members as in the invention, the substrate W may be eccentric. Considering the eccentricity, after the substrate W is loaded into inside the apparatus and set upon the support pins, the amount of eccentricity of the substrate W relative to the spin base 13 (namely, the distance between the center of rotation A0 of the spin base 13 and the center W0 of the substrate W) needs be measured. Furthermore, if the substrate W is eccentric, the horizontal position of the substrate W needs be corrected. Noting this, this embodiment requires that the position correcting unit 40 matches the center of rotation A0 of the spin base 13 with the center W0 of the substrate W in the following manner.

FIG. 13 is a drawing which shows the structure of the position correcting unit. The position correcting unit 40 includes a pressing block 41, a rod 42, a block moving mechanism 43 and a detection sensor 44. The pressing block 41 abuts on the edge surface of the substrate W which is supported for free sliding by the support pins and presses the substrate in the horizontal direction. The rod 42 supports the pressing block 41. The block moving mechanism 43 is connected with the rod 42 and moves the pressing block 41 in the horizontal direction along a line which runs over the center of rotation A0 of the spin base 13 (i.e., along the radius direction of the spin base 13). The detection sensor 44 is disposed to the rim of the substrate W and detects the position of the edge surface of the substrate W.

The first and the second support pins F1 through F12 and S1 through S12 can support the substrate W as described above. During correction of the position of the substrate W, the control unit 4 makes the second support pins S1 through S12 move away from the bottom surface of the substrate W and permits the first support pins F1 through F12 support the substrate W.

The pressing block 41 has a cylindrical shape and seats the rod 42 on its top surface. Hence, as the block moving mechanism 43 drives the rod 42 in the horizontal direction, the pressing block 41 pushes the substrate W in the horizontal direction while a side surface 41a of the pressing block 41 remains abutting on the edge surface of the substrate W.

Describing in more particular detail, the pressing block 41 (the side surface 41a) pushes the substrate W while abutting on the substrate W which is supported by the first support pins F1 through F12 in such a manner that the substrate W can freely slide. This causes greater force than the friction force developing between the back surface Wb (bottom surface) of the substrate W and the first support pins F1 through F12 to act upon the substrate W, makes the substrate W slide on the first support pins F1 through F12 and moves the substrate W along the pushing direction.

The rod 42 and the detection sensor 44 are linked to each other via a mount not shown such as a bracket. Therefore, when the block moving mechanism 43 operates in response to an operation command received from the control unit 4, the single drive system drives the pressing block 41 and the detection sensor 44 as one integrated part.

The diameter of the circle which represents the horizontal cross sectional shape of the pressing block 41 is set as described below, considering the influence of a cut-out part which is formed in the rim portion of the substrate W. In short, the substrate W to be processed is very often partially cut out. For example, the substrate W which is a semiconductor wafer includes a cut-out part such as a notch for the purpose of indicating the crystallographic reference orientation within the plane of the wafer. In this instance, when the pressing block 41 becomes opposed against the cut-out part, the pressing block 41 gets caught by the cut-out part. This makes it impossible to push the substrate W as desired. Considering such a cut-out part, the pressing block 41 has the following structure. The structure for the substrate W whose rim portion includes a notch NT will now be described.

Figure 14:
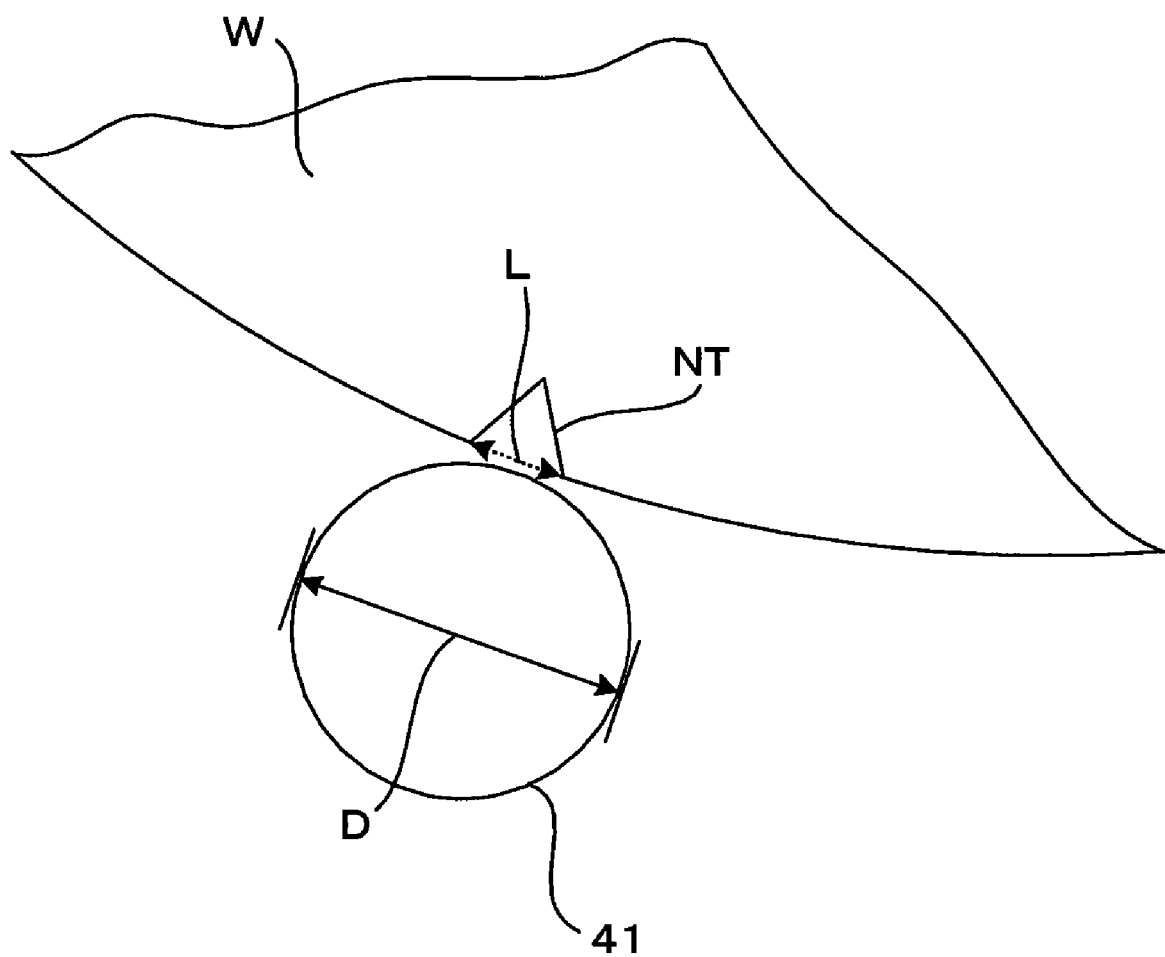
FIG. 14 is a drawing for describing the relationship between a notch of the substrate and a shape of a pressing block.

FIG. 14 is a drawing for describing the relationship between the notch of the substrate and the shape of the pressing block 41. The substrate W is approximately disk-shaped and there is the notch NT in the rim portion of the substrate. As shown in FIG. 5, the diameter D of the circle which represents the horizontal cross sectional shape of the pressing block 41 is set to be sufficiently larger than the length L of an arc out of the circumference of the substrate W which is cut out because of the notch NT. Hence, even when the notch NT is present at such a location on the edge surface of the substrate W which is opposed against the pressing block 41, it is possible to prevent the pressing block 41 from slipping into the notch NT and suppress deviation of the substrate W.

FIG. 15 is a drawing for describing an operation of the position correcting unit which is shown in FIG. 13. The block moving mechanism 43 drives the rod 42 (and the detection sensor 44) for the sake of positioning to a predetermined position P11 (the position denoted at the dotted line in FIG. 15) and a stepped-back position P12 (the position denoted at the solid line in FIG. 15). The "predetermined position P11" is a position at which the abutting section 41a (the side surface of the pressing block 41) is apart along the horizontal direction from the center of rotation A0 of the spin base 13 by a distance R which corresponds to the radius of the substrate W. The "stepped-back position P12" is a position which is spaced apart from the substrate W to the side.

The block moving mechanism 43 positions the abutting section 41a of the pressing block 41 at the predetermined position P11. The position P11 is a position which is spaced apart along the horizontal direction from the center of rotation A0 of the spin base 13 by the distance R. The distance R is calculated by adding the positive tolerance value of a target positioning accuracy to the radius of the substrate W. For instance, in the event that the diameter of the substrate W is 300 mm and the target positioning accuracy is +0.05/−0.05 mm, the abutting section 41a is moved to the predetermined position P11 which is spaced apart by 150.05 mm from the center of rotation A0 of the spin base 13. The predetermined position P11 may be a position which is spaced apart along the horizontal direction from the center of rotation A0 by the radius itself of the substrate W.

The detection sensor 44 is located to the side of the substrate W. As the spin base 13 rotates, the sensor 44 detects the position of the edge surface of the substrate W which is supported on the spin base 13. Hence the distance from the detection sensor 44 to the edge surface of the substrate W can be obtained. The relative distance between the detection sensor 44 and the center of rotation A0 of the spin base 13 is constant. Consequently, if the center W0 of the substrate is eccentric relative to the center of rotation A0 of the spin base 13, the distance from the detection sensor 44 to the edge surface of the substrate W changes as the substrate W rotates. In this manner, the distance to the edge surface of the substrate W can be detected by the detection sensor 44 while the substrate W rotates. Further, on the basis of the distance, it is possible to identify the farthest position of the edge surface from the center of rotation A0 (which will be hereinafter referred to as the "eccentric position").

The detection sensor 44 may be an optical distance sensor which includes a light projector and a light receiver for example and measures a distance by triangulation based on the position of reflected light. Alternatively, the sensor 44 may be a capacitance-type proximity sensor which measures a distance (or a change of the distance) through detection of the volume between the sensor and a target to measure, etc.

Figure 16:
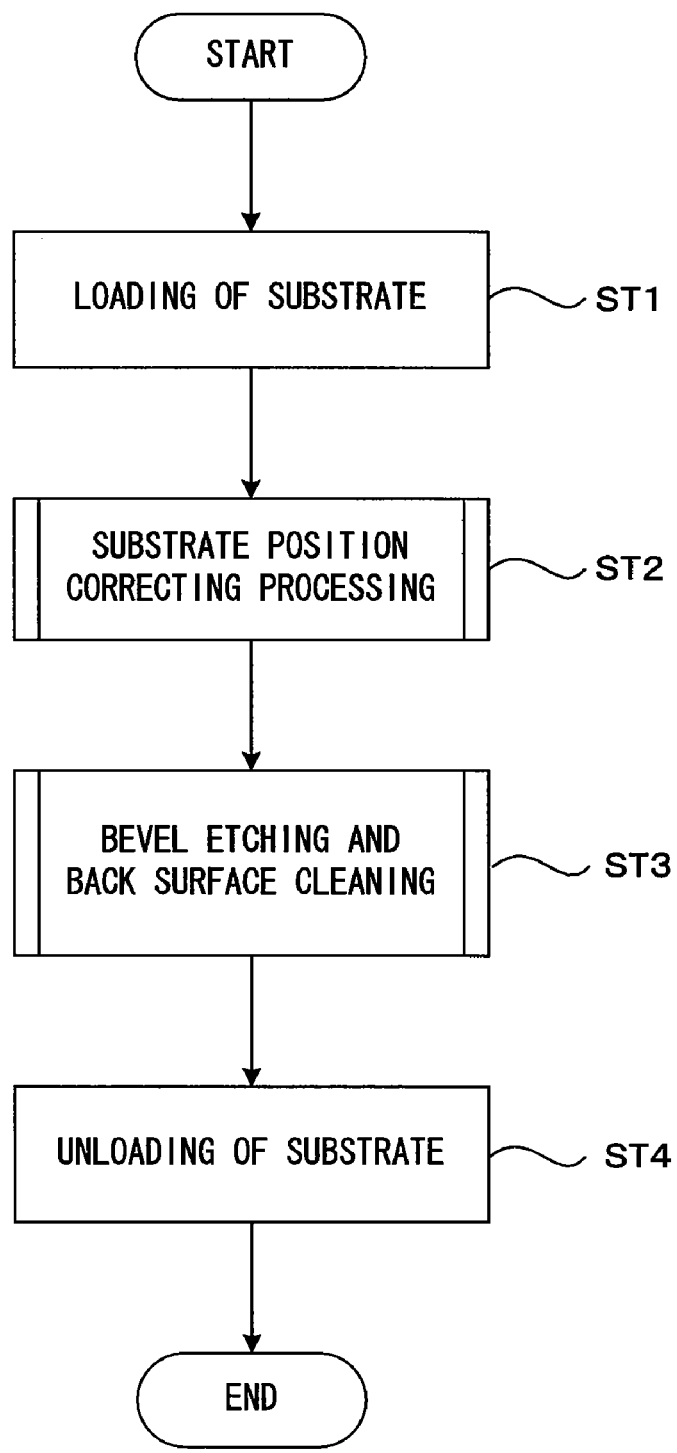
FIG. 16 is a flow chart which illustrates an operation of the substrate processing apparatus which is shown in FIG. 1.

An operation of the substrate processing apparatus having the structure above will now be described in detail while referring to FIGS. 16, 17, 18A, 18B, 19 through 21, 22A and 22B. FIG. 16 is a flow chart which illustrates the operation of the substrate processing apparatus which is shown in FIG. 1. First, the splashing preventing cup 28 is positioned at the lower position (the position denoted at the dotted line in FIG. 1), thereby making the spin chuck 1 project beyond and above the splashing preventing cup 28. The blocking plate 5 is positioned at the retract position which is above the spin chuck 1, thereby widening the gap between the blocking plate 5 and the spin chuck 1. In this condition, a transportation unit (not shown) loads the substrate W not processed yet into inside the apparatus (Step ST1).

Figure 17:
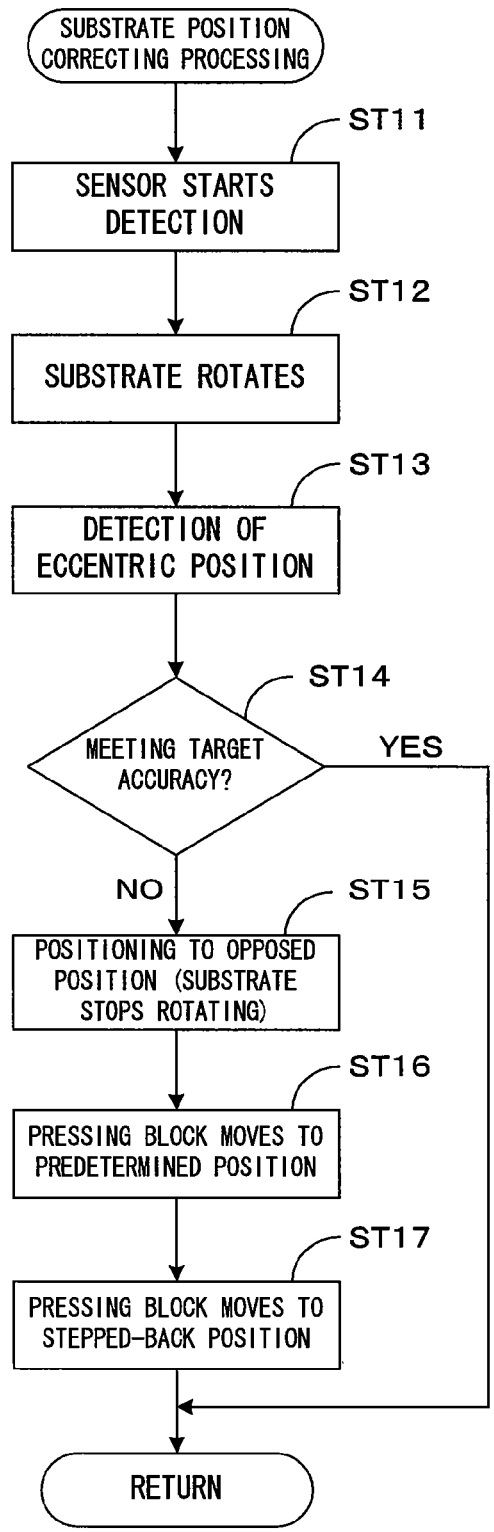
FIG. 17 is a flow chart of a substrate position correcting processing.

In this apparatus, the substrate W whose front surface Wf seats a thin film TF such as a metal film is loaded with the thin film seating surface directed toward above. The control unit 4 executes the substrate position correcting processing which is shown in FIG. 17 (Step ST2). Prior to execution of the substrate position correcting processing, the control unit 4 makes only the first support pin group consisting of the first support pins F1 through F12 support the substrate W. This prevents the restricting portions 106a formed in the second support pins S1 through S12 from blocking the detection sensor 44 from the edge surface of the substrate. This also obviates contact with the restricting portions 106a while the substrate is being pushed with the pressing block 41 abutting on the edge surface of the substrate.

Figure 18A:
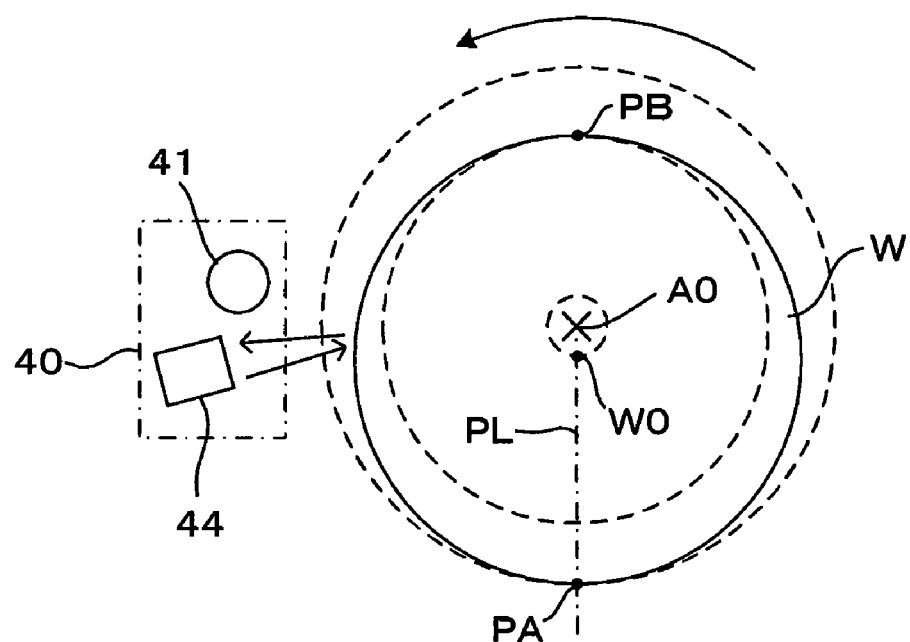
FIGS. 18A and 18B are drawings for describing an operation during the substrate position correcting processing which is shown in FIG. 17.
Figure 18B:
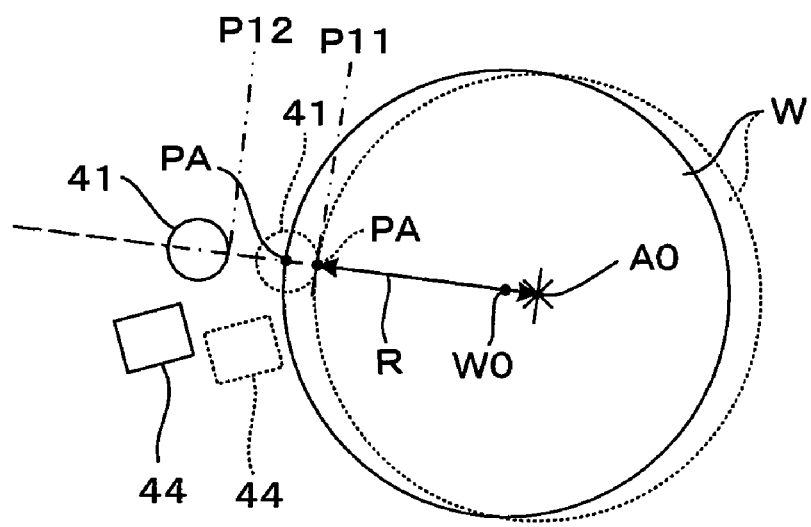

FIG. 17 is a flow chart of the substrate position correcting processing. FIGS. 18A and 18B are drawings for describing the operation during the substrate position correcting processing which is shown in FIG. 17. First, the detection sensor 44 starts measuring the distance to the edge surface of the substrate W (Step ST11). Upon detection by the detection sensor 44, the control unit 4 activates the chuck rotate/drive mechanism 12, whereby the substrate W rotates (Step ST12). At this stage, due to the friction force developing between the bottom surface of the substrate W and the first support pins F1 through F12, the substrate W rotates about the center of rotation A0 while held by the first support pins F1 through F12. A rotation position detector incorporated within the chuck rotate/drive mechanism 12 detects the rotation position of the spin base 13 and feeds the rotation position to the control unit 4. Measurement of the position of the substrate W along the circumferential direction and the distance to the edge surface of the substrate W all along the circumference of the substrate W yield a measurement result as that shown in FIG. 19.

Figure 19:
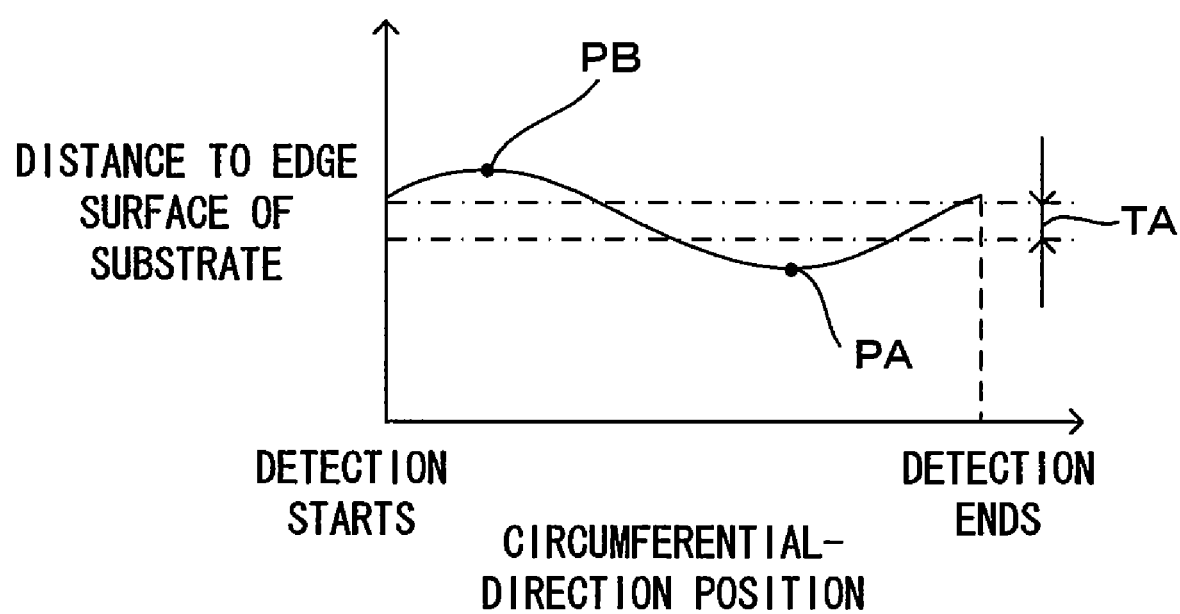
FIG. 19 is a graph of a detection result obtained by a detection sensor.

FIG. 19 is a graph of the detection result obtained by the detection sensor. To be more precise, this is a graph which shows the distance from the detection sensor 44 to the edge surface of the substrate W based on the circumferential-direction position of the substrate W which is obtained as the substrate rotates approximately one round. As shown in FIG. 19, if the center of rotation A0 and the center W0 of the substrate are off from each other (i.e., eccentric relative to each other), the distance from the detection sensor 44 to the edge surface of the substrate W changes. A minimum point PA at which this distance is the shortest and a maximum point PB at which this distance is the longest are detected. As shown in FIG. 18A, the minimum point PA corresponds to the farthest position of the edge surface from the center of rotation A0 (the eccentric position), i.e., a position at which a virtual line PL, which extends along the direction from the center of rotation A0 toward the center W0 of the substrate (namely, the direction of eccentricity), and the outer diameter of the substrate W intersect each other. The control unit 4 then calculates the eccentric position PA (the position along the direction of rotations) based on a signal transmitted from the rotation position detector and a detection signal from the detection sensor 44 (Step ST13).

The control unit 4 determines whether the distance between the minimum point PA (the eccentric position) and the maximum point PB is within a range for the target positioning accuracy TA (Step ST14). When the distance is within the range for the target accuracy TA (YES at Step ST14), the control unit 4 terminates the processing without correcting the position of the substrate W. On the contrary, when the distance is outside the range for the target accuracy TA (NO at Step ST14), the control unit 4 corrects the position of the substrate W.

Needing to correct the position of the substrate W (NO at Step ST14), the control unit 4 rotates the substrate W so that the eccentric position PA comes to a position opposed against the pressing block 41 (i.e., the position of the substrate W denoted at the solid line in FIG. 18B). The substrate W is then stopped rotating at and set to this opposed position (Step ST15).

The control unit 4 thereafter activates the block moving mechanism 43. This makes the pressing block 41 move and push the abutting section 41a (the side surface of the pressing block 41) along the direction toward the center of rotation A0 to the predetermined position P11 (which is the position denoted at the dotted line in FIG. 18B) (Step ST16). The substrate W is supported by the first support pins F1 through F12 in such a manner that the substrate W can freely slide. As the pressing block 41 pushes the substrate W with greater force than the friction force developing between the bottom surface of the substrate W and the first support pins F1 through F12, the substrate W slides horizontally on the first support pins F1 through F12 while abutting on the pressing block 41. Thus, the pressing block 41 pushes the substrate W, and the eccentric position PA is aligned to the predetermined position P11. The predetermined position P11 is a position which is spaced apart along the horizontal direction from the center of rotation A0 by the distance R which is calculated by adding the positive tolerance value of the target accuracy TA to the radius of the substrate W. Hence, as the eccentric position PA is aligned to the predetermined position P11, the position of the substrate W is corrected such that the distance from the center of rotation A0 to the center W0 of the substrate meets the target accuracy TA.

Upon correction of the position of the substrate W in this manner, the control unit 4 drives the block moving mechanism 43, thereby retracting the pressing block 41 (and the detection sensor 44) to the stepped-back position P12 which is away from the substrate W to the side (Step ST17). Further, the splashing preventing cup 28 is positioned to the upper position (the position denoted at the solid line in FIG. 1) while the first support pins F1 through F12 alone support the substrate. This attains a state that the substrate W supported by the spin base 13 and the first support pins F1 through F12 is surrounded from side positions. It is therefore possible to collect the processing liquid which gets splashed during bevel etching and back surface cleaning which will be described later.

Following this, the control unit 4 controls the respective portions of the apparatus in the following manner, thereby treating the substrate W through bevel etching and back surface cleaning (i.e., an etching step+a rinsing step+a drying step) (Step ST3). Describing in more particular detail, the control unit 4 executes a series of processing shown in the flow chart in FIG. 20.

Figure 20:
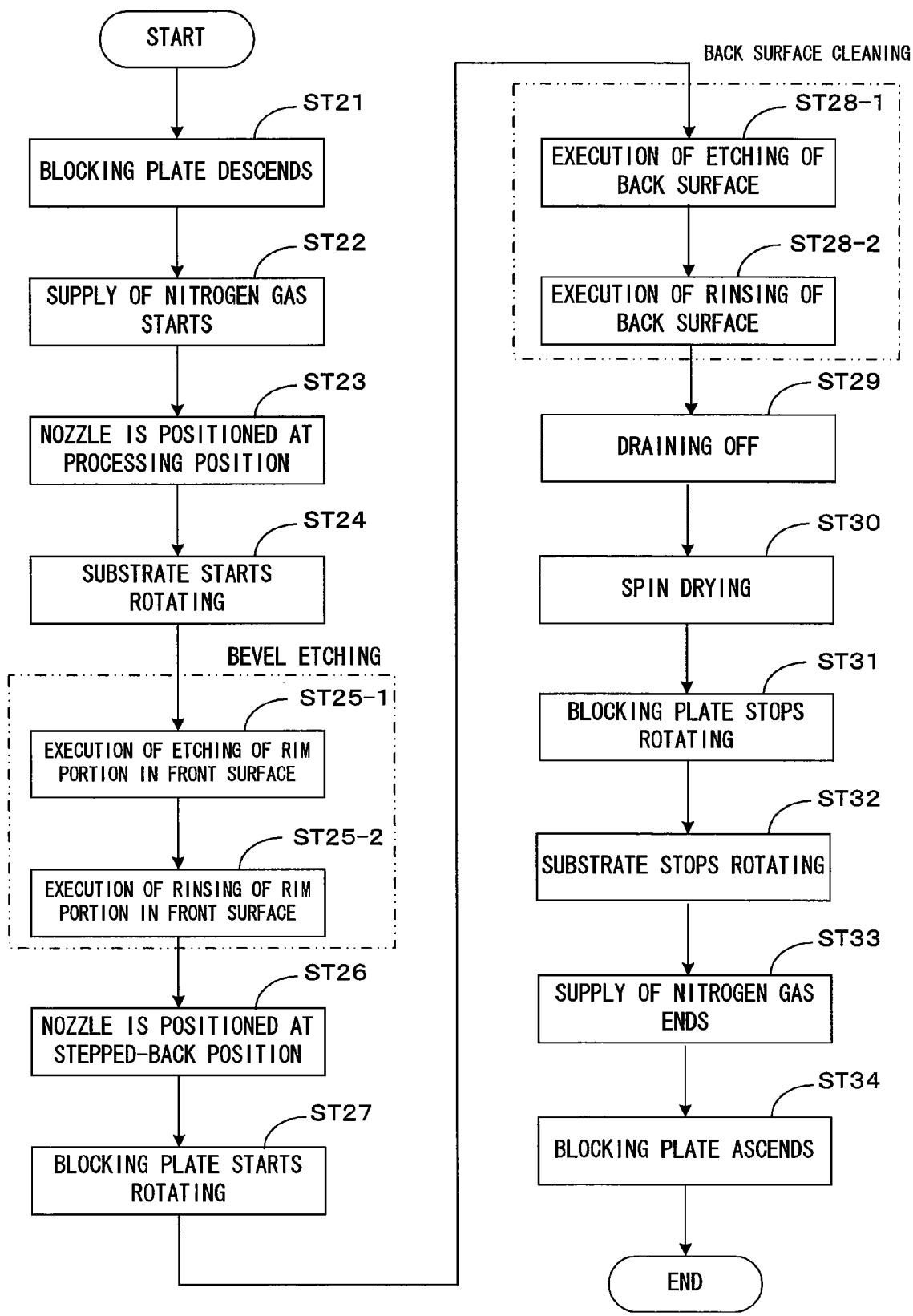
FIG. 20 is a flow chart which shows operations during bevel etching and back surface cleaning.
Figure 22A:
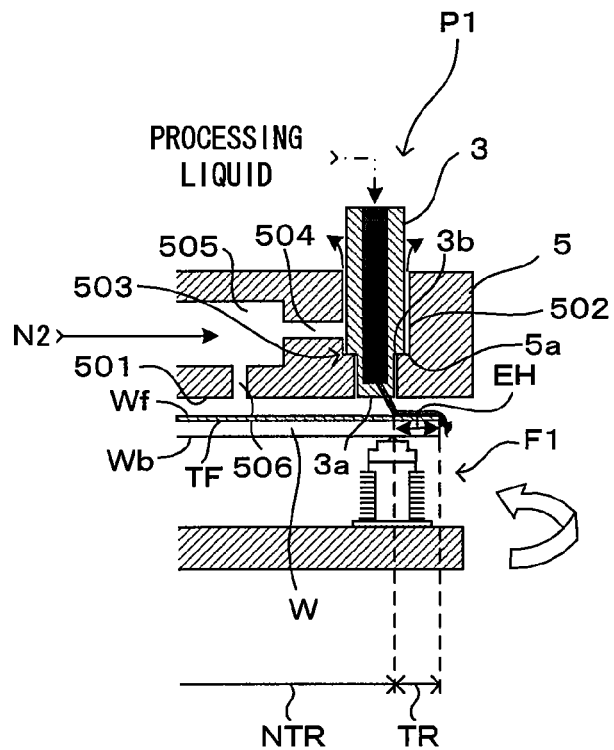
FIGS. 22A and 22B are schematic drawings of an operation of the rim processing nozzle.
Figure 22B:
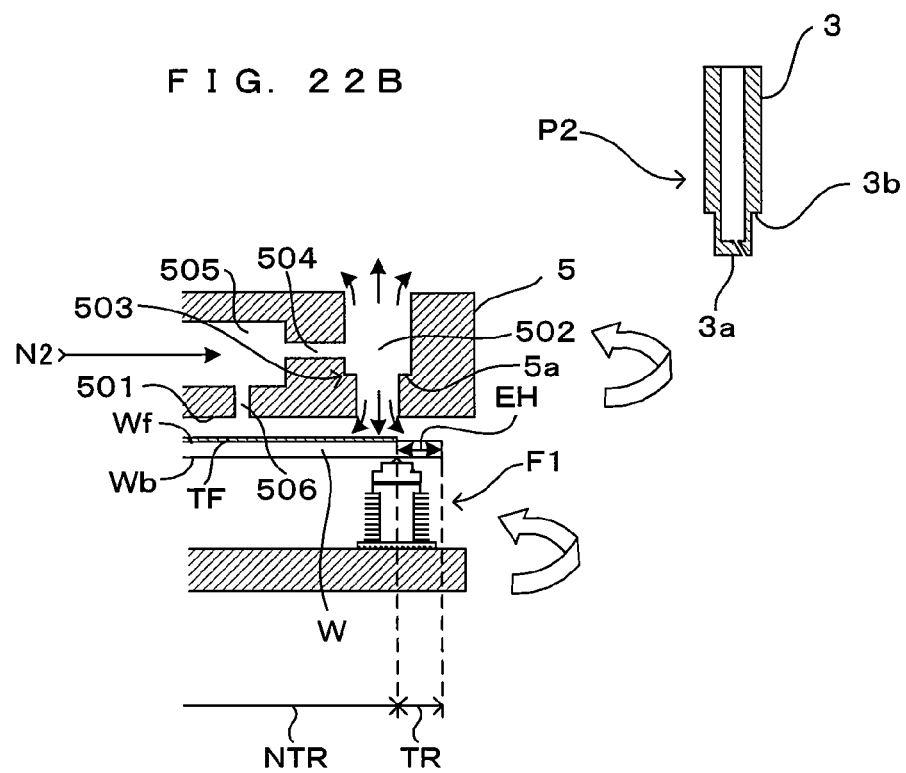

FIG. 20 is a flow chart which shows operations during bevel etching and back surface cleaning. FIG. 21 is a timing chart of an operation of the support pins. Further FIGS. 22A and 22B are schematic drawings of an operation of the rim processing nozzle 3. In FIG. 21, the indications which read "ON" for the first and the second support pins F1 through F12 and S1 through S12 denote a state that the support pins abut on the bottom surface (the back surface Wb) of the substrate W and support the substrate W, whereas the indications which read "OFF" denote a state that the support pins have descended and are away from the bottom surface (the back surface Wb) of the substrate W.

The control unit 4 moves down the blocking plate 5 to the opposed position, whereby the blocking plate 5 is positioned near the substrate W supported by the first support pins F1 through F12 and set at the opposed position (Step ST21). Nitrogen gas blows out at the gas ejection outlets 506 and is supplied toward a central section in the front surface Wf of the substrate from the gas supply path 54 (Step ST22). In short, the control unit 4 sets the holding mode to the first holding mode. This enhances the internal pressure within the space SP which is created between the opposed surface 501 of the blocking plate 5 and the front surface Wf of the substrate. Therefore, the substrate W is pressured against the first support pins F1 through F12 abutting on the bottom surface (the back surface Wb) of the substrate W and held on the spin base 13. In addition, as the front surface Wf of the substrate is covered while located very close to the opposed surface 501 of the blocking plate 5, blocking from the external atmosphere around the substrate W is ensured without fail.

The control unit 4 then activates the nozzle moving mechanism 33, whereby the rim processing nozzle 3 moves from the stepped-back position P2 to the processing position P1 (Step ST23). To be more precise, as the nozzle moving mechanism 33 operates, the rim processing nozzle 3 moves along the horizontal direction to the upper position above the through hole 502 of the blocking plate 5. Further, as the ascend/descend drive source 332 activates, the rim processing nozzle 3 moves down and is inserted into the through hole 502 until the front end surface 3a of the nozzle becomes flush with the opposed surface 501 of the blocking plate 5. At this stage, the stepped surface 3b formed on the exterior of the rim processing nozzle 3 contacts the abutting surface 5a which is formed in the inner wall of the through hole 502. This presses the rim processing nozzle 3 toward the blocking plate 5 (stepped portion 503) and the substrate W, that is, downward vertically. The rim processing nozzle 3 abuts on and gets fixed to the blocking plate 5, and is stably positioned at the processing position P1.

Following this, while keeping the blocking plate 5 in a halt, the control unit 4 drives the chuck rotate/drive mechanism 12, so that the spin base 13, and hence, the substrate W rotate (Step ST24). To be more precise, the control unit 4 rotates the spin base 13 at a first rotation speed V1 which is relatively slow (e.g., 600 rpm). At this stage, the substrate W pressed against the first support pins F1 through F12 rotates together with the spin base 15 while held by the spin base 15, due to the friction force developing between the first support pins F1 through F12 and the bottom surface of the substrate W. Since centrifugal force acting upon the substrate W is relatively small while the substrate is rotating at the first rotation speed V1 which is slow, it is possible to securely hold the substrate in the first holding mode.

The nitrogen gas is supplied into the space SP which is between the front surface Wf of the substrate and the opposed surface 501. The supplied gas flows uniformly toward the outside along the radius direction of the substrate W from the rotation axis J because of the centrifugal force attributable to the rotations of the substrate W and leaves the substrate. The nitrogen gas flows into the through hole 502 as well through the gas inlet part 504. However, a flow channel to the substrate W is blocked off since the stepped surface 3b of the rim processing nozzle 3 abuts on the abutting surface 5a which is formed in the inner wall of the through hole 502. The nitrogen gas therefore exits the through hole 502 from above the blocking plate 5 through the clearance between the inner wall of the through hole 502 and the rim processing nozzle 3 (the trunk part 304 closer to the rear end of the nozzle) without entering the space SP. This prevents the nitrogen gas from flowing into the space SP from one through hole 502, which is provided in the rim portion of the through hole 5, unevenly as viewed from the rotation axis J. Hence disturbing air flows which flow uniformly toward the outside along the radius direction from the center of rotation A0.

In this stage, the chemical solution supply unit 16 pressure-feeds the chemical solution suitable to etching into the rim processing nozzle 3 and the chemical solution is supplied as the processing liquid to the rim portion TR of the front surface (FIG. 22A). The chemical solution gushed out toward the outside along the radius direction of the substrate W, subjected to the centrifugal force attributable to the rotations of the substrate W, flows to the rim of the substrate and down the edge surface of the substrate. In this manner, the chemical solution is supplied to the entire rim portion TR of the front surface and the rim portion TR of the front surface is etched. At this stage, since the rim processing nozzle 3 is positioned at the processing position P1 as it is pressed against the stepped portion 503 of the blocking plate 5, the rim processing nozzle 3 is fixed to the blocking plate 5. This causes the position of the nozzle, and more particularly, the nozzle position along the top-to-bottom direction (the height direction) be accurately determined. This prevents air flows, vibrations and the like associated with the rotations of the substrate W from becoming influential and making the ejection position from the rim processing nozzle 3 instable. That is, air flows, vibrations and the like easily affect the nozzle arm 31 which is made of a material such as a resin whose rigidity is relatively low and the rim processing nozzle 3 which is fixed to the nozzle arm 31. However, the rim processing nozzle 3 is pressed against the blocking plate 5 which is less susceptible physically (i.e., in terms of volume, mass, disposal condition, etc.) to the influence of vibrations and the like. This prevents the ejection position from varying.

To be noted in particular, this embodiment requires discharging the chemical solution at an angle to the outside along the radius direction of the substrate W, instead of discharging vertically. This secures a constant distance between the substrate W and the rim processing nozzle 3 and obviates a change of the peripheral etching width EH. It is further possible to prevent the chemical solution discharged at the rim processing nozzle 3 from hitting the inner wall of the through hole 502 and jumping back in the event that the front end surface 3a of the nozzle is deviated toward above beyond the opposed surface 501. This obviates etching of the non-processing region NTR which is exclusive of the rim portion TR of the front surface.

Further the holding mode is set to the first holding mode and the first support pins F1 through F12 alone support the substrate W. Consequently, the chemical solution supplied to the rim portion TR of the front surface of the substrate W and discharged outside the substrate W is prevented from jumping back to the substrate W. In short, in a condition that the substrate W is held in the first holding mode, there is no part which abuts on or becomes opposed against the edge surface of the substrate W. Hence, collision of the chemical solution with such a part and splashing of the chemical solution at such a part are prevented. In addition, the absence of any factor which disturbs air flows near the rim of the substrate W reduces blowing of the mist-state chemical solution toward the front surface Wf of the substrate. This attains uniform etching and removal of an unwanted substance (thin film TF) off from the rim portion TR of the front surface all along the circumference over the constant peripheral etching width EH (Step ST25-1; top surface processing step).

Still further, the rim processing nozzle 3 is inserted into the through hole 502 of the blocking plate 5. Hence, even when the chemical solution gets splashed and jumps back toward the rim processing nozzle 3, the opposed surface 501 of the blocking plate 5 blocks the chemical solution. The chemical solution will therefore not adhere around the rim processing nozzle 3 (side surface).

After completion of etching on the rim portion TR of the front surface, the rinsing liquid is pressure-fed to the rim processing nozzle 3 and supplied to the rim portion TR of the front surface. The rinsing liquid thus washes away the chemical solution adhering to the rim portion TR of the front surface of the substrate (Step ST25-2; top surface processing step).

After completion of rinsing of the rim portion TR of the front surface, the control unit 4 stops pressure-feeding the rinsing liquid to the rim processing nozzle 3. The rim processing nozzle 3 then exits the through hole 502 and moves to the stepped-back position P2 which is spaced apart from the rim portion TR of the front surface (Step ST26). At this stage, the nitrogen gas introduced into the through hole 502 from the gas inlet part 504 gushes out at the top and the bottom openings of the blocking plate 5 toward the top-to-bottom direction of the through hole 502 (FIG. 22B). Hence, even when the rim processing nozzle 3 is already out of the through hole 502, it is possible to suppress entry of the processing liquid into the through hole 502 and jumping back of the processing liquid toward the front surface Wf of the substrate.

Following this, the control unit 4 controls the blocking plate rotate/drive mechanism 52 and accordingly makes the blocking plate 5 rotate in the same direction approximately at the same number of revolutions as those of the spin base 13 (Step ST27). The bottom surface processing nozzle 15 then supplies the processing liquid to the back surface Wb of the substrate W which rotates together with the spin base 13, which achieves back surface cleaning of the back surface Wb. To be more precise, the bottom surface processing nozzle 15 supplies the chemical solution and the rinsing liquid one after another as the processing liquids toward a central section of the back surface Wb of the substrate. This attains etching (Step ST28-1) and rinsing (Step ST28-2) of the back surface as a whole and the edge surface portion of the substrate which is contiguous to the back surface Wb (bottom surface processing step). As the blocking plate 5 rotates together with the substrate W at this stage, the following effect is obtained. In short, it is possible to prevent the processing liquid adhering to the blocking plate 5 from adversely affecting the process, suppress creation of excessive rotation-induced air flows between the substrate W and the blocking plate 5, and obviate blowing up of the processing liquid toward the front surface Wf of the substrate.

During cleaning of the back surface Wb, the control unit 4 switches the holding mode. That is, as shown in FIG. 21, the control unit 4 switches to the state that the second support pins S1 through S12 ascend and the first and the second support pins F1 through F12 and S1 through S12 support the substrate W (that is, the control unit 4 sets the mode to the third holding mode), at timing T1 during etching of the back surface Wb. At timing T2 which comes next, the control unit 4 switches to the state that the first support pins F1 through F12 descend and the second support pins S1 through S12 alone support the substrate W (that is, the control unit 4 sets the mode to the second holding mode). This permits the chemical solution flow also to the abutting sections between the first and the second support pins and the back surface Wb of the substrate and etch these sections as well. The supply of the chemical solution is stopped upon etching of the entire back surface of the substrate and the edge surface portion of the substrate which is contiguous to the back surface Wb.

After this, at timing T3, the control unit 4 switches to the state that the first support pins F1 through F12 ascend and the first and the second support pins F1 through F12 and S1 through S12 support the substrate (that is, the control unit 4 sets the mode to the third holding mode). Therefore, the rinsing liquid is pressure-fed to the bottom surface processing nozzle 15 and supplied to the back surface Wb. The control unit 4 then switches at timing T4 to the state that the second support pins S1 through S12 descend and the first support pins F1 through F12 alone support the substrate W (that is, the control unit 4 sets the mode to the first holding mode). The control unit 4 thereafter switches at timing T5 to the state that the first and the second support pins F1 through F12 and S1 through S12 support the substrate W (that is, the control unit 4 sets the mode to the third holding mode). At subsequent timing T6, the control unit 4 switches to the state that the first support pins F1 through F12 descend and the second support pins S1 through S12 alone support the substrate W (that is, the control unit 4 sets the mode to the second holding mode). At timing T7, the control unit 4 switches finally to the state that the first and the second support pins F1 through F12 and S1 through S12 support the substrate W (that is, the control unit 4 sets the mode to the third holding mode). This thus completes rinsing of the entire back surface of the substrate W and the edge surface portion of the substrate W which is contiguous to the back surface Wb while permitting the rinsing liquid flow also to the abutting sections between the first and the second support pins F1 through F12 and S1 through S12 and the back surface Wb of the substrate.

Upon completion of rinsing of the back surface Wb, the control unit 4 stops pressure-feeding of the rinsing liquid to the bottom surface processing nozzle 15 while keeping the substrate W rotating. Therefore, the substrate W is drained off of a liquid component remaining on the substrate W and the liquid component is discharged to outside the substrate (Step ST29).

The control unit 4 then increases the rotation speeds of the chuck rotate/drive mechanism 12 and the blocking plate rotate/drive mechanism 52 and makes the substrate W and the blocking plate 5 rotate at a high speed. Describing in more particular detail, the control unit 4 makes the spin base 13 rotate from the first rotation speed V1 to a second rotation speed V2 (e.g., 1500 rpm) which is faster than the first rotation speed V1. This achieves drying of the substrate W (spin drying) (Step ST30; drying step). Nitrogen gas is supplied from the gas supply path 19 while nitrogen gas is supplied in the manner described above the front surface Wf of the substrate, thereby supplying nitrogen gas to the front and the back surfaces of the substrate W. This facilitates drying of the front and the back surfaces of the substrate W.

At this stage, since the increased rotation speed intensifies the centrifugal force which acts upon the substrate W, the substrate W is more likely to move horizontally because of the centrifugal force. However, as the restricting portions 106a formed in the second support pins S1 through S12 restrict the horizontal movement of the substrate W without fail, it is possible to prevent damaging of the substrate W or the like. In addition, the first and the second support pins F1 through F12 and S1 through S12 support in this state (the third holding mode). Due to this, more support pins support the substrate W at the bottom surface of the substrate than in the first or second holding mode. This makes it possible to prevent warping of the substrate W and enhance the friction force developing between the first support pins and the substrate W. Consequently, the substrate W is more securely held.

As the substrate W is spin dried in this fashion, the control unit 4 controls the motor for the blocking plate rotate/drive mechanism 52, thereby stopping the blocking plate 5 from rotating (Step ST31), and controls the chuck rotate/drive mechanism 12, thereby stopping the substrate W from rotating (Step ST32). The supply of the nitrogen gas from the gas supply path 54 and the gas ejection outlets 506 is stopped. This makes the substrate W be released from the first and the second support pins F1 through F12 and S1 through S12 (Step ST33). This completes bevel etching and back surface cleaning.

The control unit 4 thereafter makes the blocking plate 5 move upward to the retract position which is above the spin chuck 1 and positions the splashing preventing cup 28 to the lower position (the position denoted at the dotted line in FIG. 1), thereby making the spin chuck 1 project beyond and above the splashing preventing cup 28. In this state, the transportation unit (not shown) unloads the substrate W which has been processed from the apparatus, which completes cleaning of one substrate W (Step ST4).

As described above, this embodiment uses the two types of support pins which are different from each other, namely, the first support pins F1 through F12 and the second support pins S1 through S12 and allows a selective change of the holding mode in accordance with the content of processing of the substrate W. Therefore, it is possible to favorably process the substrate W while rotating substrate W and maintaining the substrate W always in an appropriate mode which meets the content of processing of the substrate W.

In short, in this embodiment, the centrifugal force which acts upon the substrate W is relatively small while the spin base 13 is rotating at the first rotation speed V1 (low speed), thereby realizing secure holding of the substrate W in the first holding mode. Meanwhile, for substrate processing at the second rotation speed V2 (high speed), the substrate W is held in the third holding mode, which restricts horizontal movement of the substrate W without fail and prevents damaging or the like of the substrate W.

Further, as the substrate W is held in the third holding mode while the spin base 13 is rotating at the second rotation speed V2, both the first support pins F1 through F12 and the second support pins S1 through S12 support the substrate W. This makes it possible to stably hold the substrate W at the spin base 13 while suppressing warping of the substrate W during high-speed rotation.

In addition, this embodiment requires setting the holding mode to the first holding mode for processing of the rim portion TR of the front surface of the substrate W while supplying the processing liquid to the rim portion TR of the front surface of the substrate W. This prevents the processing liquid supplied to the rim portion TR of the front surface of the substrate W and discharged to outside the substrate from jumping back to the substrate W. Hence, This attains uniform processing all along the circumference over the peripheral etching width EH.

Further, requiring switching of the holding mode among the first, the second and the third holding modes for processing of the back surface Wb of the substrate W while supplying the processing liquid to the back surface Wb, this embodiment secures that the processing is uniform. In other words, the processing liquid is supplied also to the abutting section between the first support pins F1 through F12 and the substrate W and the abutting section between the second support pins S1 through S12 and the substrate W, thereby processing the entire back surface completely. Moreover, since the holding mode is switched from the first holding mode to the second holding mode after switching to the third holding mode, it is possible to securely hold the substrate W while keeping the substrate W rotating.

Further, in this embodiment, the first and the second support pins F1 through F12 and S1 through S12 are structured capable of supporting the substrate W at the same support positions PS. Hence, the height-direction position of the substrate W will never change at the time of switching of the holding mode. When the holding mode is switched therefore, it is possible to keep the internal pressure within the space SP constant without changing the gap between the top surface (front surface Wf) of the substrate W and the opposed surface 501 of the blocking plate 5. This in turn attains stable holding of the substrate W without varying the friction force between the substrate W and the support pins.

The invention is not limited to the embodiment described above but may be modified in various manners in addition to the embodiments above, to the extent not deviating from the object of the invention. For instance, although the embodiment above requires setting the holding mode to the third holding mode for execution of spin drying, the holding mode may be set to the second holding mode. Even with such setting of the holding mode, it is possible to restrict horizontal movement of the substrate W and prevent damaging or the like of the substrate W.

Further, the embodiment above requires controlling the first motor M1 and the second motor M2 independently of each other to thereby move the first support pins F1 through F12 and the second support pins S1 through S12 toward above and below. Alternatively, the first support pins F1 through F12 and the second support pins S1 through S12 may be driven to ascend and descend in a concerted manner.

Further, the embodiment above requires executing bevel etching, which removes an unwanted thin film FT formed on the rim portion TR of the front surface of the substrate W, and back surface cleaning which cleans the back surface Wb. Alternatively, the invention may be applied to a substrate processing apparatus which performs bevel etching alone or back surface cleaning alone. The invention is applicable also to a substrate processing apparatus which supplies the processing liquid from the back surface Wb and makes the processing liquid flow over to the rim portion TR of the front surface to thereby process the rim portion TR of the front surface.

The invention is generally applicable to a substrate processing apparatus which treats surfaces of substrates, including semiconductor wafers, glass substrates for photomask, glass substrates for liquid crystal display, glass substrates for plasma displays and substrates for disk substrates, with predetermined processing while rotating the substrates approximately horizontally.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus which performs predetermined processing on a substrate while rotating the substrate approximately horizontally, the apparatus comprising:

a rotating part which is structured to rotate freely;

a rotator which rotates the rotating part;

a first supporter including at least three or more first support members each of which is disposed upward on the rotating part, the first supporter being structured to ascend and descend freely, and having a support portion which is structured to abut on a bottom surface of the substrate so as to support the substrate approximately horizontally;

a second supporter including at least three or more second support members each of which is disposed upward on the rotating part, the second supporter being structured to ascend and descend freely, and having a support portion and a restricting portion which are formed in a leading end thereof, the support portion being structured to abut on the bottom surface of the substrate so as to support the substrate approximately horizontally, the restricting portion being located closer to a rim of the substrate than the support portion so as to abut on the edge surface of the substrate and accordingly restrict horizontal movement of the substrate;

an ascend/descend section which makes the first support members and the second support members ascend and descend;

a pressing section which is structured to supply gas to a top surface of the substrate from above so as to press the substrate toward the first support members and/or the second support members; and a controller which controls the ascend/descend section and the pressing section, thereby selectively switching between a first holding mode and a second holding mode in accordance with a content of processing of the substrate, the first holding mode being a mode in which the first support members support the substrate and the pressing section presses the substrate toward the first support members to make the rotating part hold the substrate, the second holding mode being a mode in which the second support members support the substrate and the pressing section presses the substrate toward the second support members to make the rotating part hold the substrate.

2. The substrate processing apparatus of claim 1, wherein the controller selectively switches among the first holding mode, the second holding mode and a third holding mode in accordance with the content of processing of the substrate, the third holding mode being a mode in which the first support members and the second support members support the substrate and the pressing section presses the substrate toward the first support members and the second support members to make the rotating part hold the substrate.

3. The substrate processing apparatus of claim 1, wherein the controller, for processing of the substrate while rotating the rotating part at a first rotation speed, sets a holding mode to the first holding mode, but to the second holding mode for processing of the substrate while rotating the rotating part at a second rotation speed which is faster than the first rotation speed.

4. The substrate processing apparatus of claim 2, wherein the controller, for processing of the substrate while rotating the rotating part at a first rotation speed, sets a holding mode to the first holding mode, but to the third holding mode for processing of the substrate while rotating the rotating part at a second rotation speed which is faster than the first rotation speed.

5. The substrate processing apparatus of claim 1, further comprising a rim processing nozzle which supplies a processing liquid to a rim portion in the top surface of the substrate and processes the rim portion in the top surface with the processing liquid,
wherein upon supplying the processing liquid to the substrate from the rim processing nozzle, the controller sets a holding mode to the first holding mode.

6. The substrate processing apparatus of claim 2, further comprising a bottom surface processing nozzle which supplies a processing liquid to the bottom surface of the substrate and accordingly processes the bottom surface of the substrate with the processing liquid,
wherein upon supplying the processing liquid to the substrate from the bottom surface processing nozzle, the controller switches a holding mode among the first, the second and the third holding modes.

7. The substrate processing apparatus of claim 1, wherein the number of the first support members of the first supporter is equal to the number of the second support members of the second supporter.

8. The substrate processing apparatus of claim 1, wherein the ascend/descend section includes a first ascend/descend part and a second ascend/descend part, the first ascend/descend part moving the first support members upward and downward, the second ascend/descend part moving the second support members upward and downward, and
the controller controls the first ascend/descend part and the second ascend/descend part independently of each other, thereby driving and making the first supporter and the second supporter ascend and descend.

9. The substrate processing apparatus of claim 1, wherein the first support members and the second support members are capable of supporting the substrate at the same support positions which are above the rotating part by a predetermined distance.

10. The substrate processing apparatus of claim 1, wherein the height of the restricting portions of the second support members is lower than that of the top surface of the substrate which is supported by the support portions.

11. The substrate processing apparatus of claim 1, wherein the pressing section includes:
a plate-shaped member which has an opposed surface faced against the top surface of the substrate and formed a plurality of gas ejection outlets; and
a gas supply part which discharges gas through the gas ejection outlets and supplies the gas to a space which is created between the opposed surface and the top surface of the substrate.

12. The substrate processing apparatus of claim 11, further comprising a plate-shaped member rotating part which rotates the plate-shaped member approximately horizontally,
wherein the plate-shaped member rotating part rotates the plate-shaped member together with the substrate in a state that the pressing section maintains the substrate held by the rotating part.

* * * * *